United States Patent [19]
Aizawa et al.

[11] Patent Number: 5,608,237
[45] Date of Patent: Mar. 4, 1997

[54] BIDIRECTIONAL SEMICONDUCTOR SWITCH

[75] Inventors: Yoshiaki Aizawa; Toshimitu Katoh, both of Kanagawa-ken, Japan

[73] Assignee: Kabushiki Kaisha Toshiba, Kanagawa-ken, Japan

[21] Appl. No.: 403,519

[22] Filed: Mar. 13, 1995

[30] Foreign Application Priority Data

Mar. 14, 1994 [JP] Japan .................................. 6-042706
Mar. 2, 1995 [JP] Japan .................................. 7-042960

[51] Int. Cl.⁶ .......................... H01L 29/74; H01L 23/58; H01L 31/111
[52] U.S. Cl. .......................... 257/132; 257/119; 257/121; 257/212
[58] Field of Search ..................... 257/212, 119, 257/132, 121

[56] References Cited

U.S. PATENT DOCUMENTS

| | | | |
|---|---|---|---|
| 4,939,564 | 7/1990 | Asakura et al. | 257/132 |
| 4,994,884 | 2/1991 | Kato et al. | 257/132 |
| 5,493,134 | 2/1996 | Mehrotra et al. | 257/132 |

*Primary Examiner*—Stephen Meier
*Assistant Examiner*—Valencia Martin Wallace
*Attorney, Agent, or Firm*—Finnegan, Henderson, Farabow, Garrett & Dunner, L.L.P.

[57] ABSTRACT

A bidirectional semiconductor switch employs two insulated gate semiconductor devices such as insulated gate bipolar transistors (IGBTs) that are connected oppositely in parallel, with the collector of one of the IGBTs being connected to the emitter of the other. The gates of the IGBTs are biased by gate controllers that are potentially independent of each other. The semiconductor switch is capable of controlling a direct current as well as an alternating current at a low ON-state voltage, reducing a conduction loss, and improving efficiency.

27 Claims, 19 Drawing Sheets

FIG. 1
PRIOR ART
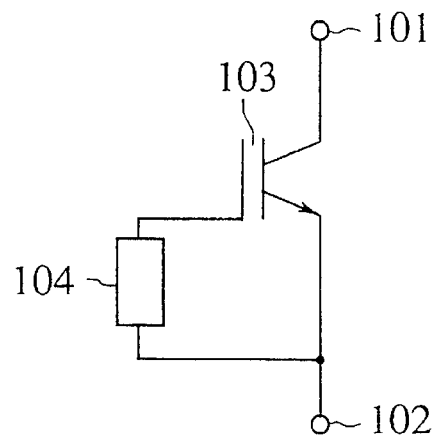
FIG. 2A
PRIOR ART
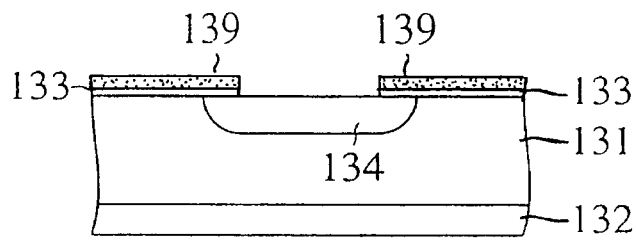
FIG. 2B
PRIOR ART
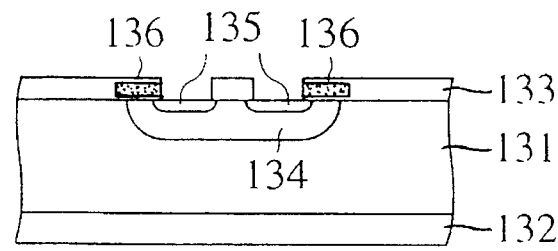
FIG. 2C
PRIOR ART
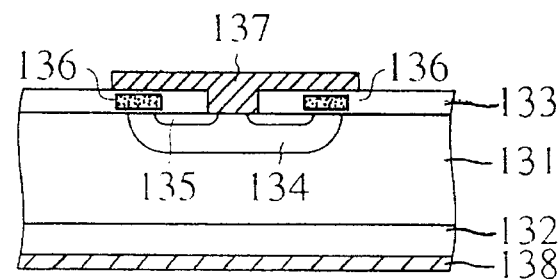
FIG. 2D
PRIOR ART 5,608,237

BIDIRECTIONAL SEMICONDUCTOR SWITCH

BACKGROUND OF THE INVENTION

1. Field of the Invention

The present invention relates to a semiconductor device such as an insulated gate bipolar transistor (IGBT) having an insulated gate for controlling a current, and particularly, to a semiconductor device serving as a bidirectional switch that controls a direct current as well as an alternating current.

2. Description of the Prior Art

An insulated gate bipolar transistor (IGBT) is capable of controlling a large current in response to a relatively low bias voltage applied to the gate electrode thereof. The IGBT is a MOS bipolar composite function element adopted for power electronics, to control power and switch a current.

FIG. 1 is a circuit diagram showing a semiconductor switch employing an IGBT according to a prior art, and FIGS. 2A to 2D are sectional views showing the processes of fabricating the IGBT.

In FIG. 1, the semiconductor switch has the IGBT 103 having a collector connected to an output terminal 101, an emitter connected to an output terminal 102, and a gate electrode to be biased by a gate controller 104.

In FIG. 2A, an n⁻-type substrate 131 serving as an n⁻-type base layer is prepared. A p⁺-type anode layer 132 is formed on the bottom surface of the substrate 131 by diffusing boron. Instead, a p⁺-type substrate may be employed, and an n⁻-type epitaxial layer may be formed on the substrate. In this case, the substrate serves as a p⁺-type anode layer 132, and the epitaxial layer serves as an n⁻-type base layer 131. In FIG. 2B, an SiO₂ film 133 serving as a gate oxide film is formed on the top surface of the substrate 131, and a polysilicon layer 139 serving as an insulated gate electrode 136 is formed on the gate oxide film 133. A window is formed at the center of the polysilicon layer 139, and through the window, a p-type base layer 134 is formed by diffusing boron to the top surface of the substrate 131.

In FIG. 2C, the polysilicon layer 139 is left at a part to form the gate electrode 136, and a new SiO₂ film 133 is formed on the top surface of the substrate 131. Two windows are formed at the center of the SiO₂ film 133, and through the windows, an n⁺-type emitter layer 135 is formed by diffusing, for example, arsenic to the base layer 134 by double diffusion.

The polysilicon layer 139 is patterned into the gate electrode 136 by photolithography or RIE. An SiO₂ film is formed over the exposed base layer 134 and gate electrode 136. In FIG. 2D, an emitter electrode 137 is formed over the SiO₂ film 133 at the center of the substrate 131. A collector electrode 138 is formed to cover the anode layer 132 on the bottom surface of the substrate 131, to complete the IGBT 103 of FIG. 1.

The operation of the IGBT will be explained. To turn ON the IGBT, the emitter electrode 137 is grounded, and a positive voltage is applied to the collector electrode 138. Under this state, a positive voltage is applied to the gate electrode 136 with respect to the emitter electrode 137. Similar to a MOSFET, the positive voltage applied to the gate electrode 136 forms an inverted channel, or inversion layer along the surface of the base layer 134, so that electrons are injected from the emitter layer 135 into the base layer 131 through the reverse channel. At the same time, holes are injected from the anode layer 132 into the base layer 131, to form a forward bias state in a pn junction between the anode layer 132 and the base layer 131. This changes the conductivity of the base layer 131, to turn ON the element. In this way, the IGBT is turned ON when the conductivity of the high-resistance base layer 131 is changed to drastically decrease the resistance thereof. Even if the base layer 131 is low in impurity concentration and thick to increase a breakdown voltage, the ON-state resistance RON of the element will be very small. To turn OFF the IGBT, the gate electrode 136 is zero-biased with respect to the emitter electrode 137, or a negative voltage is applied to the gate electrode 136. Then, the reverse channel under the gate electrode 136 disappears, to stop the injection of electrons from the emitter layer 135. At this time, electrons are present in the base layer 131. Holes accumulated in the base layer 13i mostly flow into the emitter electrode 137 through the base layer 134 and partly recombine with the electrons in the base layer 131, to disappear. When all of the holes in the base layer 131 disappear, the element turns OFF.

The semiconductor switch of FIG. 1 employing the singular IGBT is capable of controlling only a current flowing from the output terminal 101 connected to the collector electrode 138 toward the output terminal 102 connected to the emitter electrode 137 and is incapable of controlling a current flowing reversely. Namely, this switch is incapable of controlling an alternating current. FIGS. 3 and 4 show conventional bidirectional semiconductor switches capable of controlling a direct current as well as an alternating current. The switch of FIG. 3 employs MOSFETs 113 and 114, which are connected oppositely in series between output terminals 111 and 112. The gates of the MOSFETs 113 and 114 are biased by a gate controller 115. This switch is capable of passing a current flowing from the output terminal 111 toward the output terminal 112, or from the output terminal 112 toward the output terminal 111. Namely, the switch controls a direct current as well as an alternating current.

The bidirectional semiconductor switch of FIG. 4 employs two IGBTs 123 and 124, which are connected oppositely in series between output terminals 121 and 122. A reverse diode 125 is connected between the collector and emitter of the IGBT 123, and a reverse diode 126 is connected between the collector and emitter of the IGBT 124. The gate electrodes of the IGBTs 123 and 124 are biased by a gate controller 116. The IGBTs 123 and 124 are manufactured according to the processes of FIGS. 2A to 2D. The switch of FIG. 4 is capable of passing a current between the output terminals 121 and 122 in both directions. Namely, the switch controls a direct current as well as an alternating current.

The ON-state voltage $V_{ON}$ of the bidirectional semiconductor switch of FIG. 3 consisting of MOSFETs is higher than that of the bidirectional semiconductor switch consisting of IGBTs. In addition, the two MOSFETs connected oppositely in series further increase the ON-state voltage. For example, the ON-state voltage of a MOSFET of 500 V in breakdown voltage is about three times higher than that of an IGBT of the same breakdown voltage and chip area. In addition, the ON-state voltage of the semiconductor switch of FIG. 3 is doubled because the MOSFETs are connected oppositely in series.

In FIG. 4, one of the reverse diodes 125 and 126 is connected to a current path in series, and therefore, the ON-state voltage of the reverse diode is added to the ON-state voltage of the IGBTs, to increase the total ON-state voltage. The breakdown voltage and current capacity of each reverse diode must be equal to those of the corresponding IGBT, to increase the cost.

SUMMARY OF THE INVENTION

An object of the present invention is to provide a semiconductor device capable of controlling a direct current as well as an alternating current at a low ON-state voltage, achieving a high breakdown voltage, and being manufactured at low cost.

In order to accomplish the object, the present invention provides a bidirectional semiconductor switch of FIG. 5. The switch has two IGBTs 1 and 2 that are connected oppositely in parallel such that the collector of one of the IGBTs is connected to the emitter of the other. The switch has a gate controller 5 for controlling the gate of the IGBT 1, and a gate controller 6 for controlling the gate of the IGBT 2. As shown in FIG. 6, each of the gate controllers may have a photodiode array 5a (6a) for producing photovoltaic force in response to light from a light emitter 7 such as an LED. The IGBTs are fabricated according to an isolation diffusion method or a glass passivation method, as shown in FIGS. 8A to 8E, 9A to 9E, and 10A to 10E. The gate controllers bias the gates of the IGBTs, respectively, to control a direct current or an alternating current between the nodes of the collectors and emitters of the IGBTs at a low ON-state voltage. The bidirectional semiconductor switch of the present invention may consist of not only the IGBTs but also other types of gate insulated semiconductor devices such as ESTs (emitter switched thyristors) or BRTs (base resistance controlled thyristors).

The photodiode arrays of the gate controllers of FIG. 6 optically couple the input and output ends of the switch with each other. Namely, the input end is electrically isolated from the output end, and therefore, noise in the power system, i.e., main current system is isolated from noise in the control system, to secure a stable switching operation. Since a voltage at the LED at the input end is independent of a voltage at the output end, a direct current or an alternating current is controlled at a low ON-state voltage. Main switching elements such as IGBTs may be fabricated according to the isolation diffusion or glass passivation method. These methods improve the reverse breakdown voltage of the switch when the collector of an IGBT is at negative potential and the emitter thereof at positive potential, equal to the forward breakdown voltage of the switch when the collector of an IGBT is at positive potential and the emitter thereof at negative potential.

The present invention integrates any one of the bidirectional semiconductor switches of FIGS. 5, 6, 17, and 18 on the same semiconductor substrate as shown in FIGS. 16 and 19 to 23.

The bidirectional semiconductor switches according to the present invention are highly efficient and applicable to programmable controllers and telephone loops.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the present invention in practice.

BRIEF DESCRIPTION OF THE DRAWINGS

FIG. 1 is a circuit diagram showing a semiconductor switch employing an IGBT according to a prior art;

FIGS. 2A to 2D are sectional views showing the processes of manufacturing the IGBT of FIG. 1;

DETAILED DESCRIPTION OF THE EMBODIMENTS

Figure 3:
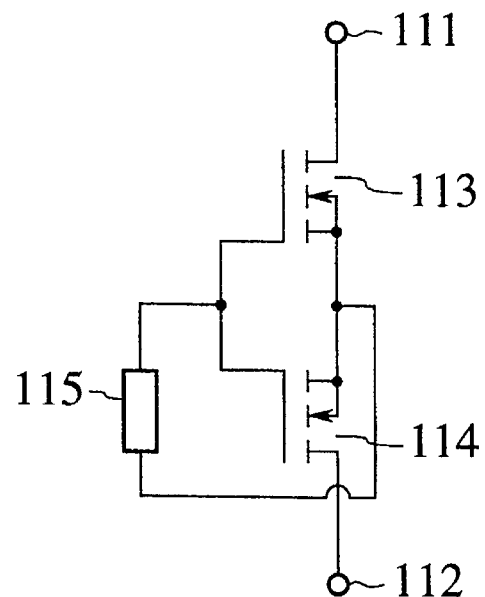
FIG. 3 is a circuit diagram showing a bidirectional semiconductor switch employing MOSFETs according to a prior art.
Figure 4:
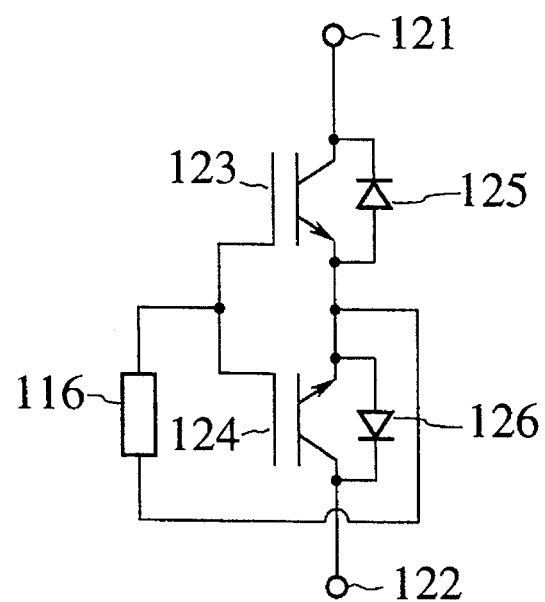
FIG. 4 is a circuit diagram showing a bidirectional semiconductor switch employing two IGBTs according to a prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 5:
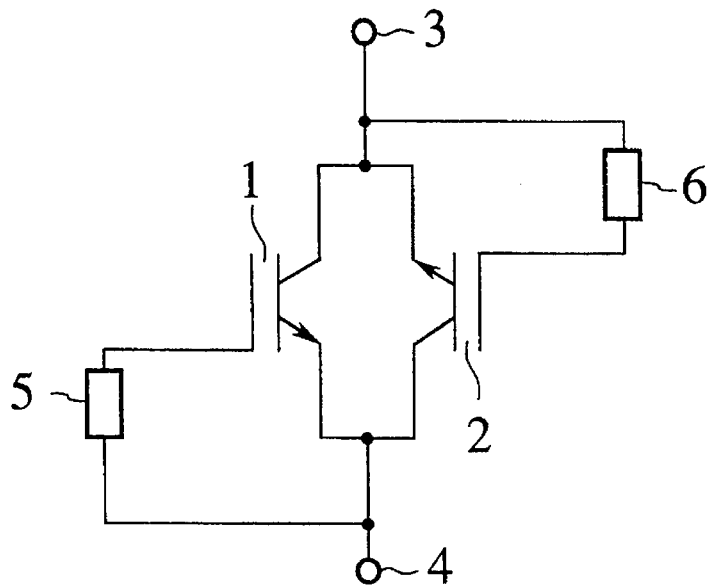
FIG. 5 is an equivalent circuit showing a bidirectional semiconductor switch according to a first embodiment of the present invention.

FIG. 5 is a circuit diagram showing a bidirectional semiconductor switch according to the first embodiment of the present invention. This switch has two IGBTs 1 and 2 that are connected oppositely in series between output terminals 3 and 4. The collector of the IGBT 1 and the emitter of the IGBT 2 are connected to the output terminal 3, and the emitter of the IGBT 1 and the collector of the IGBT 2 are connected to the output terminal 4. The gate electrode of the IGBT 1 is biased by a gate controller 5, and the gate electrode of the IGBT 2 is biased by a gate controller 6, so that the IGBT 1 passes a current flowing from the output terminal 3 toward the output terminal 4, and the IGBT 2 passes a current flowing from the output terminal 4 toward the output terminal 3, to thereby control an alternating current. The ON-state voltage of the prior art of FIG. 3 employing MOSFETs is three times larger than that of a circuit employing IGBTs and is further doubled because the MOSFETs are connected reversely in series. On the other hand, the first embodiment of the present invention connects the IGBTs reversely in parallel, to thereby decrease the ON-state voltages thereof. Compared with a conventional semiconductor switch of the same chip area employing MOSFETs or IGBTs, the semiconductor switch of the first embodiment is capable of controlling a larger current, decreasing a conductivity loss, and increasing conversion efficiency.

Figure 6:
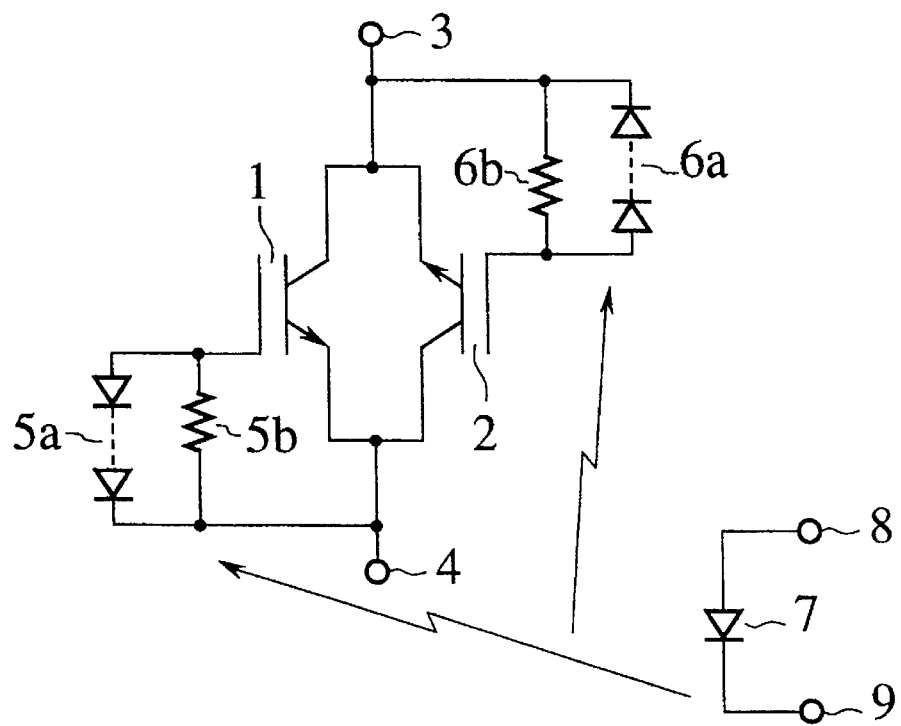
FIG. 6 is an equivalent circuit showing a bidirectional semiconductor switch according to a second embodiment of the present invention.

FIG. 6 is a circuit diagram showing a semiconductor switch according to the second embodiment of the present invention. The same reference marks as those of FIG. 5 represent like parts. The second embodiment employs photodiode arrays 5a and 6a for gate controllers 5 and 6, respectively, to bias the gate electrodes of IGBTs 1 and 2. A resistor 5b is connected in parallel with the photodiode array 5a, and a resistor 6b is connected in parallel with the photodiode array 6a. A light emitting diode (LED) 7 for emitting light toward the photodiode arrays 5a and 6a is connected between input terminals 8 and 9. When a current is passed between the input terminals 8 and 9, the LED 7 emits light, which simultaneously or alternately irradiates the photodiode arrays 5a and 6a to simultaneously or alternately generate photovoltaic force. The photovoltaic force simultaneously or alternately biases the gate electrodes of the IGBT 1 and 2, to turn ON a path between output terminals 3 and 4. In this way, the second embodiment optically couples the input side with the output side. Namely, the input side is electrically isolated from the output side, and therefore, noise in the main power system is independent of noise in the control system, to secure a stable switching operation. The gate controllers 5 and 6 cause substantially no power loss, to improve the conversion efficiency of the semiconductor switch.

Figure 7:
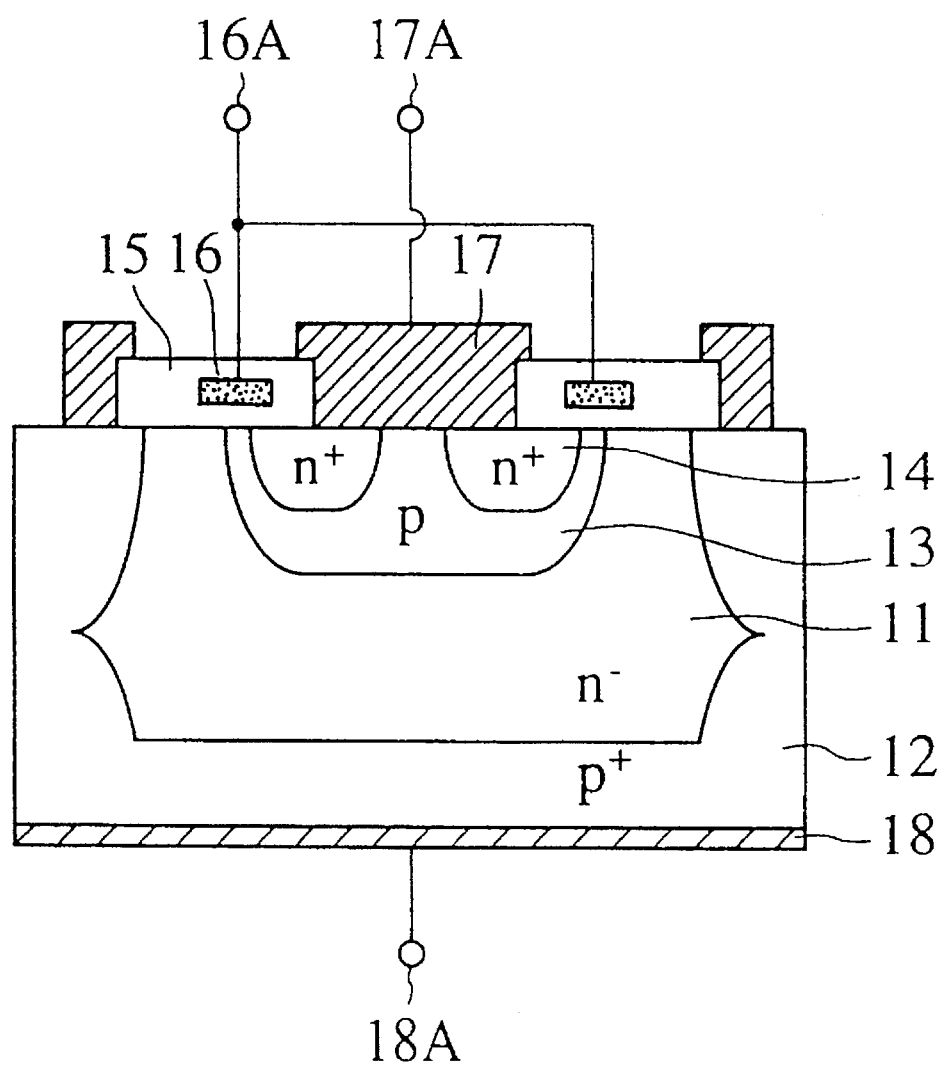
FIG. 7 is a sectional view showing an n-channel IGBT chip adopted for the first and second embodiments of the present invention.

FIG. 7 is a sectional view showing an IGBT having an improved breakdown voltage, adopted for the semiconductor switches of the first and second embodiments of the present invention. The IGBT is formed of an n⁻-type substrate 11 of $5\times10^{12}$ to $2\times10^{14}$ cm$^{-3}$ in impurity concentration. The bottom surface of the substrate 11 is covered with a p⁺-type diffusion layer (anode layer) 12 of $5\times10^{18}$ to $2\times10^{19}$ cm$^{-3}$ in impurity concentration. Each side of the IGBT is also covered with the diffusion layer 12 by isolation diffusion (element separation diffusion). The top surface of the substrate 11 has a p-type base layer 13 of $5\times10^{15}$ to $2\times10^{17}$ cm$^{-3}$ in impurity concentration. A pair of emitter layers 14 of $5\times10^{18}$ to $2\times10^{21}$ cm$^{-3}$ in impurity concentration are formed along the surface of the base layer 13. An SiO$_2$ film 15 covers the surfaces of the diffusion layer 12, substrate 11, base layer 13, and emitter layers 14. A gate electrode 16 is formed in the SiO$_2$ film 15 above the base layer 13. The gate electrode 16 is insulated from the chip surface by the SiO$_2$ film 15, to provide an insulated gate structure. On the SiO$_2$ film 15 above the base layer 13 and emitter layers 14, there is formed an emitter electrode 17 from Al, Ti/Al, or Al—Si. The bottom surface of the diffusion layer 12 is covered with a collector electrode 18 made of Ti/Al, W, or Mo. The gate electrode 16, emitter electrode 17, and collector electrode 18 are connected to a gate terminal 16A, an emitter terminal 17A, and a collector terminal 18A, respectively. When a bias voltage exceeding a threshold is applied to the gate electrode 16, the base layer 13 produces an electric field to form a channel in the base layer 13. In a reverse blocking state with the collector 18 being negative and the emitter 17 being positive, the diffusion layer 12 is negatively biased with respect to the substrate 11, to reversely connect a parasitic diode between the substrate 11 and the diffusion layer 12. This improves the reverse breakdown voltage of the IGBT.

Figure 8A:
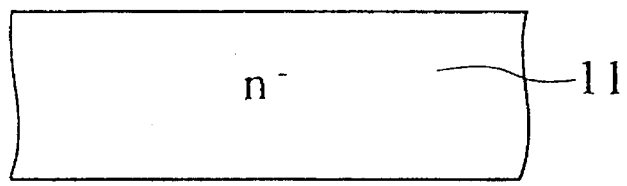
FIGS. 8A to 8E are sectional views showing the processes of manufacturing the IGBT chip of FIG. 7.
Figure 8B:
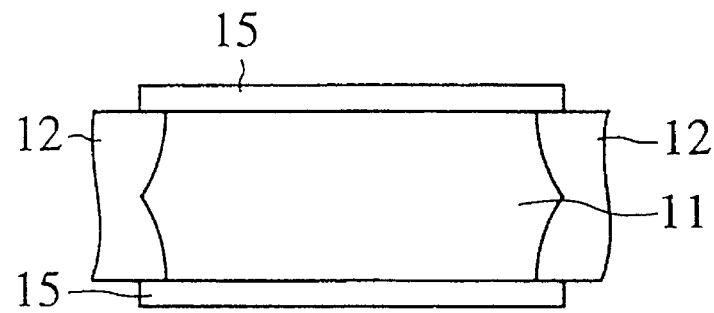
Figure 8C:
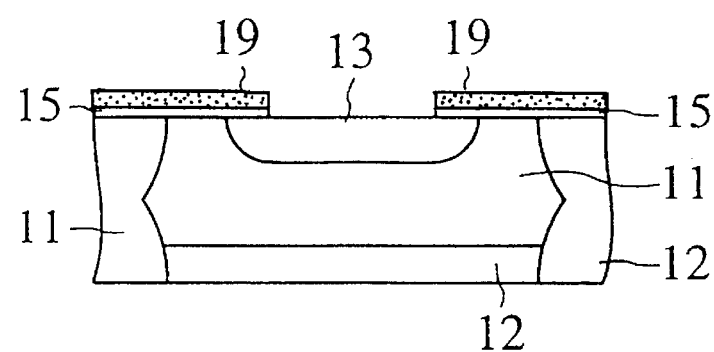
Figure 8D:
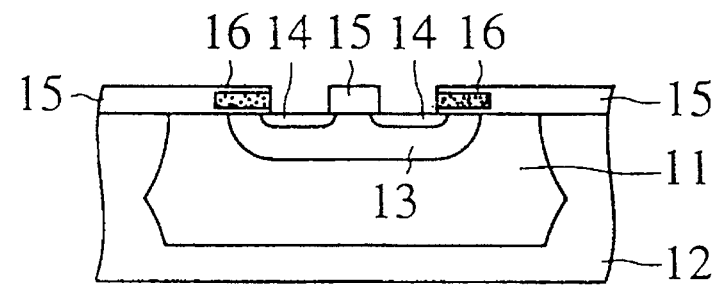
Figure 8E:
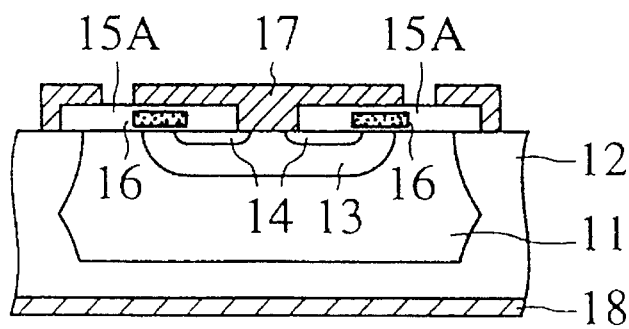

FIGS. 8A to 8E show the processes of manufacturing the IGBT of FIG. 7. In FIG. 8A, a substrate 11 of 150 to 450 μm thick and $5\times10^{12}$ to $2\times10^{14}$ cm$^{-3}$ in impurity concentration is prepared. The top and bottom surfaces of the substrate 11 are covered with SiO$_2$ films 15 each of 400 to 700 nm thick by thermal oxidation. In FIG. 8B, boron, aluminum, or gallium is diffused by isolation diffusion to each side of the substrate 11, to form a p⁺-type diffusion layer 12 of $1\times10^{17}$ to $5\times10^{18}$ cm$^{-3}$ in impurity concentration. In FIG. 8C, boron, for example, is diffused to the bottom surface of the substrate 11, to form a p-type anode layer 12 of 20 to 50 μm thick and $2\times10^{17}$ to $2\times10^{19}$ cm$^{-3}$ in impurity concentration. The SiO$_2$ film 15 used as a diffusion mask is removed, and a new SiO$_2$ film 15 of 50 to 100 nm thick serving as a gate oxide film is formed on the top surface of the substrate 11 by thermal oxidation. On the SiO$_2$ film 15, a polysilicon film 19 of 350 to 500 nm thick is formed. A window is opened at the center of the film 19, and through the window, boron is diffused to the surface of the substrate 11, to form a p-type base layer 13 of 10 to 30 μm thick and $1\times10^{15}$ to $5\times10^{17}$ cm$^{-3}$ in impurity concentration. In FIG. 8D, a part of the polysilicon layer 19 is left to form a gate electrode 16, and a new SiO$_2$ film 15 of 350 to 500 nm thick is formed on the substrate 11. Two diffusion windows are formed at the center of the SiO$_2$ film 15 above the base layer 13. Through the diffusion windows, arsenic, for example, is diffused to the base layer 13, to form n⁺-type emitter layers 14 each of 0.5 to 5 μm thick and $5\times10^{18}$ to $1\times10^{21}$ cm$^{-3}$ impurity concentration. This is done by double diffusion. In FIG. 8E, a new SiO$_2$ film 15A of 350 to 500 nm thick is formed on the substrate 11 by CVD. A contact hole is formed through the SiO$_2$ film 15A, and through the contact hole, an emitter electrode 17 of 0.5 to 3 μm thick is formed from Al, Ti/Al, or Al—Si above the base layer 13 and emitter layer 14. A contact electrode 18 is formed from Ti/Al, W, or Mo over the bottom surface of the diffusion layer 12, to complete the IGBT of FIG. 7.

Figure 9A:
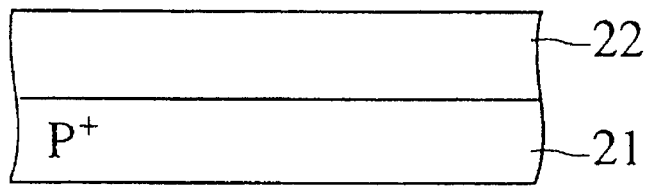
FIGS. 9A to 9E are sectional views showing the processes of manufacturing another n-channel IGBT chip adopted for the first and second embodiments of the present invention.
Figure 9B:
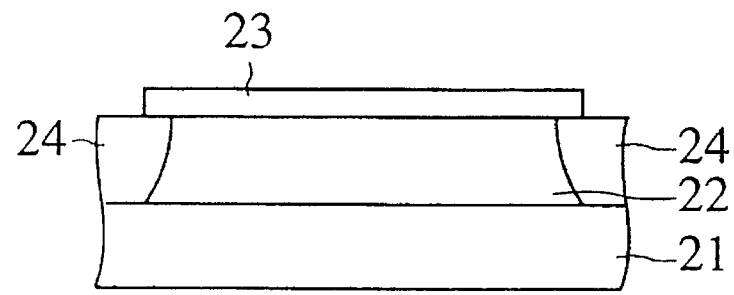
Figure 9C:
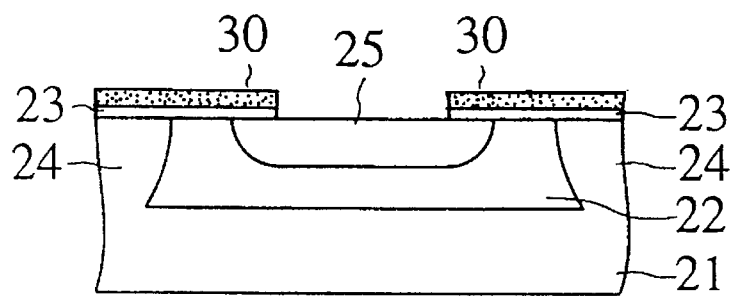
Figure 9D:
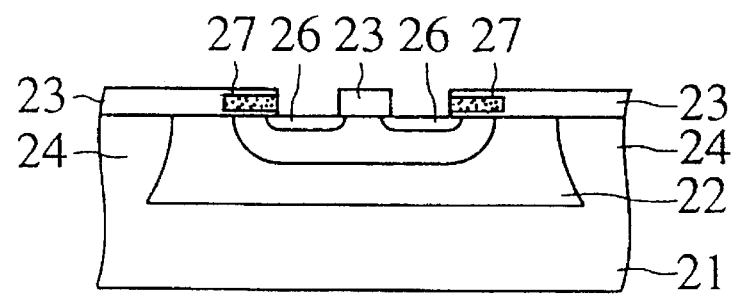
Figure 9E:
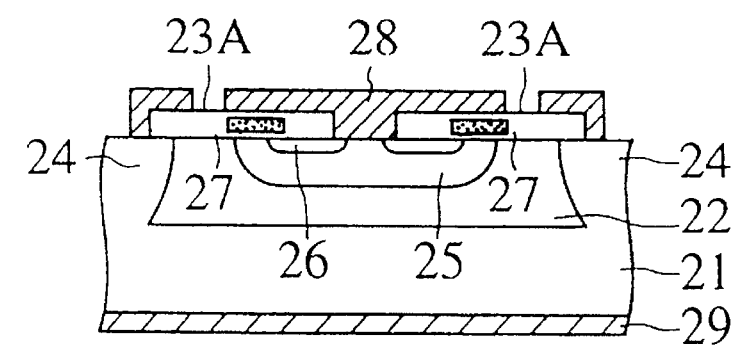

FIGS. 9A to 9E are views showing the processes of manufacturing an IGBT of another type adopted for the first and second embodiments of the present invention. This IGBT is formed by isolation diffusion to improve the reverse breakdown voltage thereof. In FIG. 9A, a substrate 21 of $1\times10^{18}$ to $3\times10^{18}$ cm$^{-3}$ in impurity concentration and 150 to 300 μm thick is prepared. An n$^-$-type epitaxial layer 22 of $5\times10^{12}$ to $2\times10^{14}$ cm$^{-3}$ in impurity concentration and 50 to 150 μm thick is formed on the substrate 21. In FIG. 9B, an SiO$_2$ film 23 of 400 to 700 nm thick is formed on the epitaxial layer 22 by thermal oxidation. A p$^+$-type diffusion layer 24 is formed along the side of the epitaxial layer 22 by isolation diffusion. In FIG. 9C, a gate oxide film of 50 to 100 nm is formed according to the process of FIG. 8C. On the gate oxide film, a polysilicon film 30 is formed by CVD. A p-type base layer 25 is formed in the epitaxial layer 22. In FIG. 9D, n$^+$-type emitter layers 26 are formed in the base layer 25. In FIG. 9E, an SiO2 layer 23A of 350 to 500 nm thick is formed on the epitaxial layer 22 by CVD. A contact hole is formed through the SiO$_2$ film 23A, and through the contact hole, an emitter electrode 28 is formed. A collector electrode 29 is formed on the bottom surface of the substrate 21, to complete the IGBT.

Figure 10A:
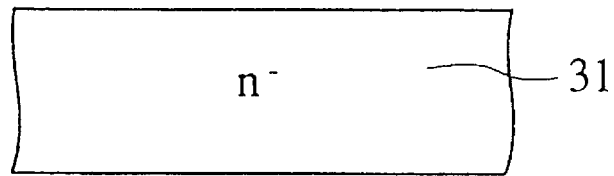
FIGS. 10A to 10E are sectional views showing the processes of manufacturing still another n-channel IGBT chip adopted for the first and second embodiments of the present invention.
Figure 10B:
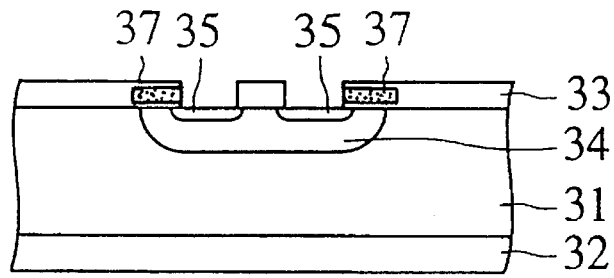
Figure 10C:
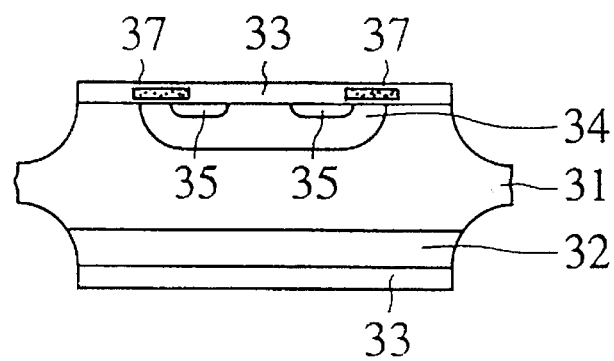
Figure 10D:
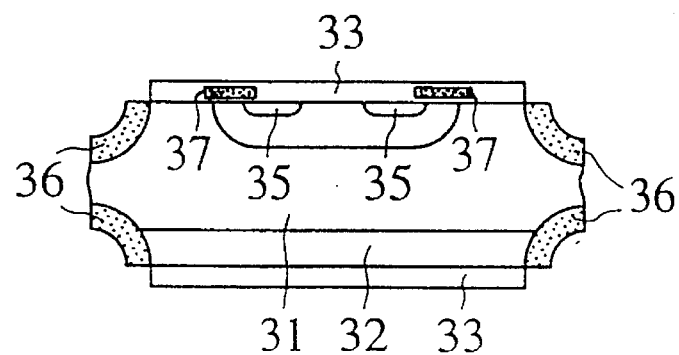
Figure 10E:
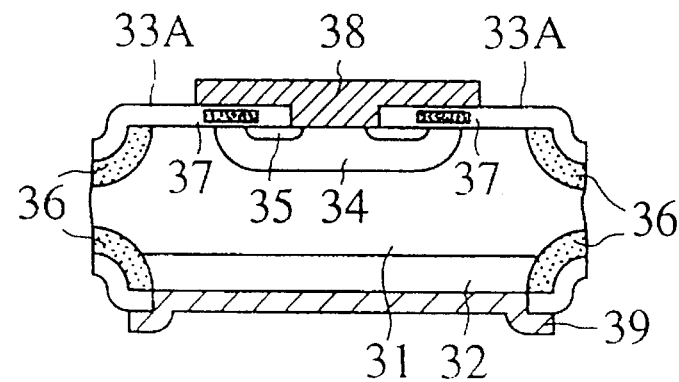

FIGS. 10A to 10E show the processes of manufacturing an IGBT of still another type adopted for the first and second embodiments of the present invention. To increase a reverse breakdown voltage, the IGBT of this example is formed by glass passivation instead of the isolation diffusion of FIGS. 8A to 8E and 9A to 9E. In FIG. 10A, an n$^-$-type substrate 31 of $3\times10^{12}$ to $1\times10^{14}$ cm$^{-3}$ in impurity concentration and 250 to 600 μm thick is prepared. In FIG. 10B, impurities are diffused to the bottom surface of the substrate 31 to form a p$^+$-type anode layer 32 of 30 to 50 μm thick. An SiO$_2$ film 33 and a polysilicon layer 37 are formed on the top surface of the substrate 31, and a p-type base layer 34 is formed in the substrate 31, similar to FIGS. 8C and 9C. N$^+$-type emitter layers 35 are formed in the base layer 34. A gate electrode 37 is formed from the polysilicon layer 37 in the SiO$_2$ film 33. An SiO$_2$ film 33 is formed on the top and bottom surfaces of the substrate 31 by CVD. In FIG. 10C, the peripheries of the top and bottom surfaces of the substrate 31 are etched to leave the side centers thereof. In FIG. 10D, a glass layer 36 is formed on the etched side slopes of the substrate 31 by glass passivation. In FIG. 10E, an SiO$_2$ film 33A is formed on the glass layer 36 on the top and bottom surfaces of the substrate 31. An emitter electrode 38 is formed on the top surface of the substrate 31, and a collector electrode 39 is formed along the bottom surface of the anode layer 32, to complete the IGBT. This IGBT may be made not only by glass passivation but also by SIPOS (semi insulating polysilicon) or by SinSiN (semi insulating, silicon nitride).

The bidirectional semiconductor switches of FIGS. 5 and 6 according to the first and second embodiments of the present invention may be realized as a power module or a power hybrid IC by soldering elements such as the IGBTs 1 and 2 and gate controllers 5 and 6 of FIGS. 7, 8E, 9E, and 10E to a ceramic substrate such as an alumina (Al$_2$O$_3$) or aluminum nitride (AlN) substrate, or an insulated metal substrate.

Figure 11A:
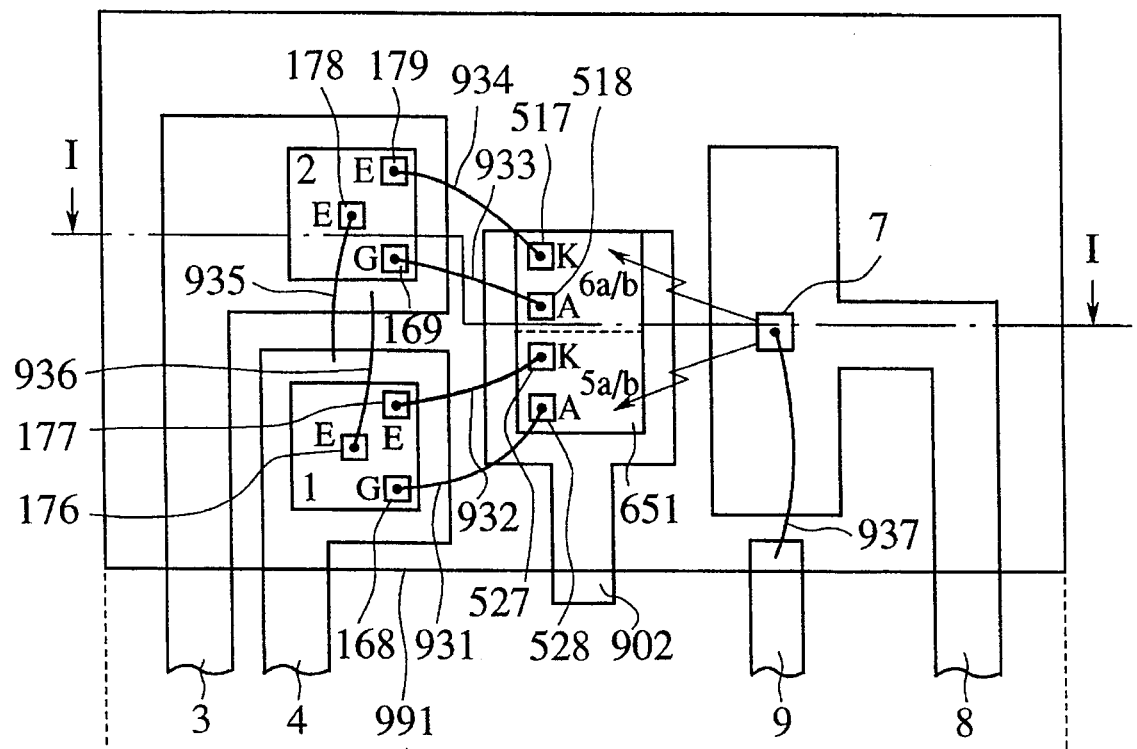
FIG. 11A is a plan view showing IGBTs 1 and 2, photodiode arrays 5a and 6a, resistors 5b and 6b, and an LED 7 mounted on lead frames, respectively, and packed in resin according to a third embodiment of the present invention.
Figure 11B:
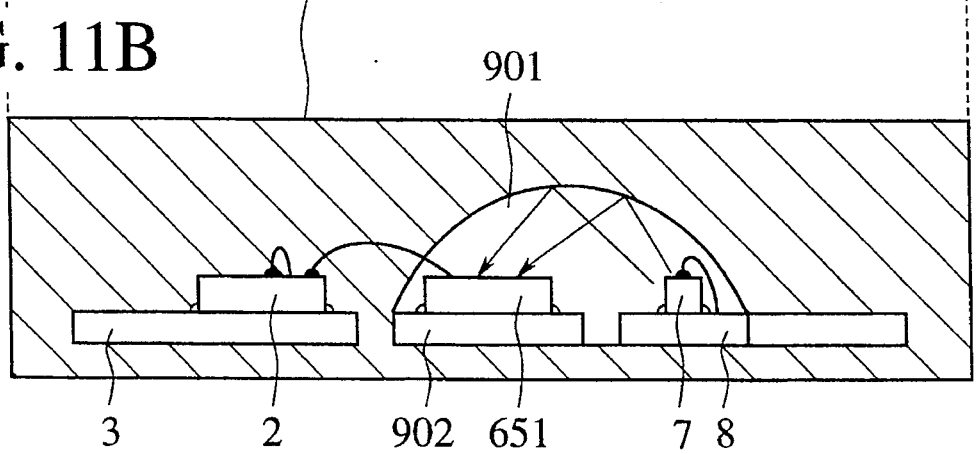
FIG. 11B is a sectional view taken along a line I—I of FIG. 11A.

FIG. 11A shows a package according to the third embodiment of the present invention, and FIG. 11A shows a section taken along a line I—I of FIG. 11A. IGBTs 1 and 2 are mounted on lead frames 4 and 3, respectively. Photodiode arrays 5a and 6a and resistors 5b and 6b are integrated on a semiconductor chip 651, which is mounted on a lead frame 902. An LED 7 such as a GaAs LED or a GaAs/AlGaAs heterojunction LED is mounted on a lead frame 8. An electrode of the LED 7 is connected to a bonding wire 937, which is connected to a lead frame 9. The LED 7 and semiconductor chip 651 are packed in transparent rubber or gel silicon resin 901, to effectively reflect light from the LED 7 by an interface between the resin 901 and a package 991 toward the photodiode arrays 5a and 6a. A cathode bonding pad 527 and anode bonding pad 528 of the photodiode array 5a are connected to an emitter bonding pad 177 and gate bonding pad 168 of the IGBT 1 through gold or aluminum bonding wires 932 and 931, respectively. A cathode bonding pad 517 and anode bonding pad 518 of the photodiode array 6a are connected to an emitter bonding pad 179 and gate bonding pad 169 of the IGBT 2 through bonding wires 934 and 933, respectively. An emitter bonding pad 176 of the IGBT 1 is connected to the lead frame 3 through a bonding wire 936, to thereby connect the emitter of the IGBT 1 to the collector of the IGBT 2. An emitter bonding pad 178 of the IGBT 2 is connected to the lead frame 4 through a bonding wire 935, to thereby connect the emitter of the IGBT 2 to the collector of the IGBT 1. The diameter of the bonding wires 931 to 936 may be 100 to 650 μmφ.

Figure 12A:
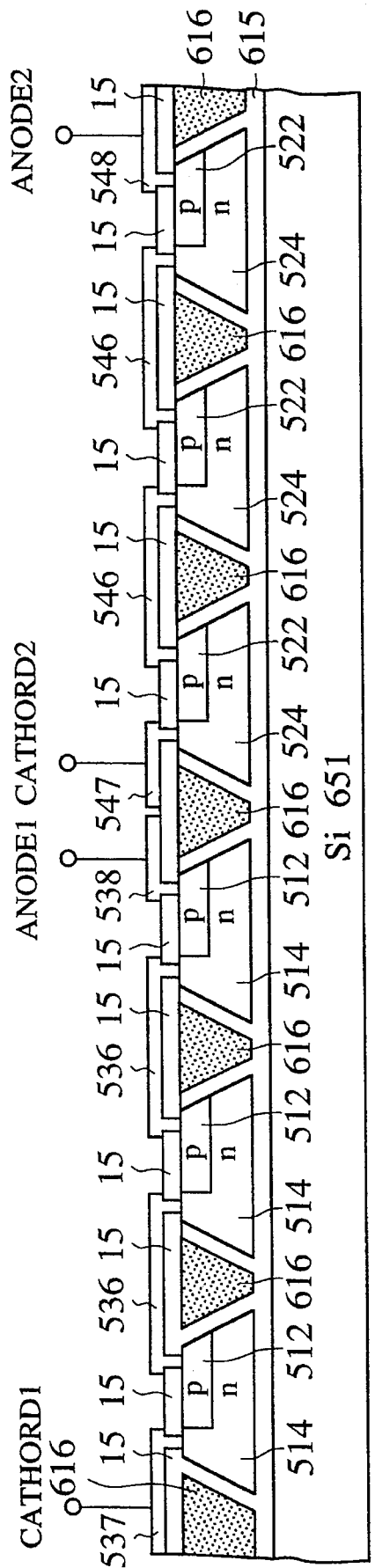
FIG. 12A is a sectional view showing photodiode arrays adopted for the third embodiment of the present invention.
Figure 12B:
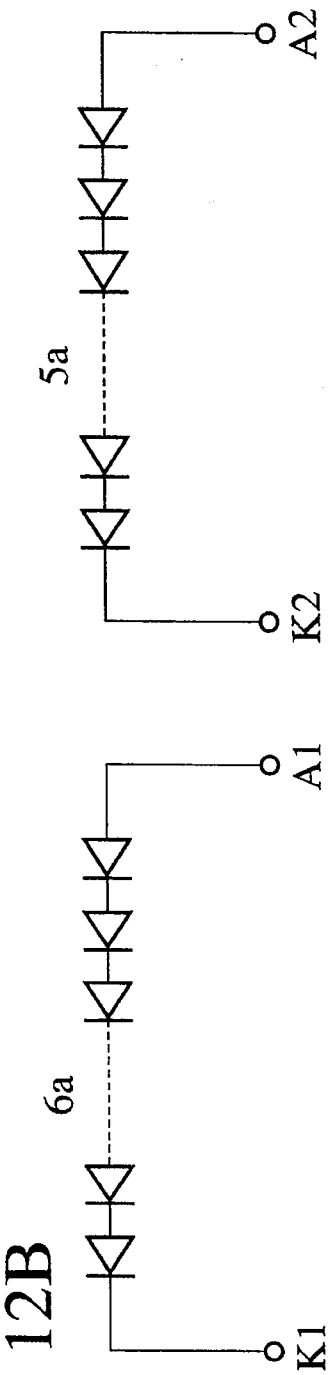
FIG. 12B is an equivalent circuit showing the photodiode arrays of FIG. 12A.

FIG. 12 is a sectional view showing the semiconductor chip 651 of FIG. 11A on which the photodiode arrays 5a and 6a are integrated. These arrays 5a and 6a are isolated from each other by dielectric isolation. The photodiode array 6a includes photodiodes each consisting of an n-type cathode region 514 and a p-type anode region 512. The photodiode array 5a includes photodiodes each consisting of an n-type cathode region 524 and a p-type anode region 522. The photodiodes in the array 6a are connected to one another through an Al wire 536 formed on an oxide film 15, and the photodiodes in the array 5a are connected to one another through an Al wire 546 formed on the oxide film 15. An Al wire 537 of the array 6a is connected to the cathode bonding pad 517 (FIG. 11A), and an Al wire 538 thereof is connected to the anode bonding pad 518 (FIG. 11A). Similarly, Al wires 547 and 548 of the array 5a are connected to the cathode bonding pad 527 and anode bonding pad 528, respectively.

In FIG. 12, the type of the semiconductor substrate 651 may be any one of p and n. The photodiodes are separated from one another with an oxide film 615 and a polysilicon film 616. The structure of FIG. 12 may be formed on an SOI wafer fabricated by SDB (silicon direct bonding) technology with the oxide film 615 being interposed between the substrate 651 and the n-type layers 514 and 524 serving as cathode regions. Grooves are formed from the surfaces of the n-type layers 514 and 524 of the SOI wafer up to the oxide film 615 by RIE or ECR ion etching. The grooves are also formed by orientation-dependent wet etching with potassium hydroxide (KOH), etc. An oxide film is formed on the top surfaces of the n-type layers 514 and 524 by thermal oxidation. The polysilicon layer 616 is formed on the oxide film by reduced pressure CVD, to fill the grooves and form dielectric isolation regions. If the surface of the polysilicon layer 616 is irregular, it is polished to make it flush with the surfaces of the n-type layers 514 and 524. Thereafter, the p-type anode layers 512 and 522 are diffused. In FIG. 12, each of the photodiode arrays 5a and 6a includes three photodiodes. The number of photodiodes in each array may be determined according to the characteristics of the IGBT. For example, 16 photodiodes may be connected in series to provide a gate control voltage of about 8 V. In FIG. 12, the resistors 5b and 6b are omitted. These resistors may be formed from a polysilicon layer formed on the semiconductor chip 651, or by diffusing p-type silicon into n-type silicon.

Figure 13A:
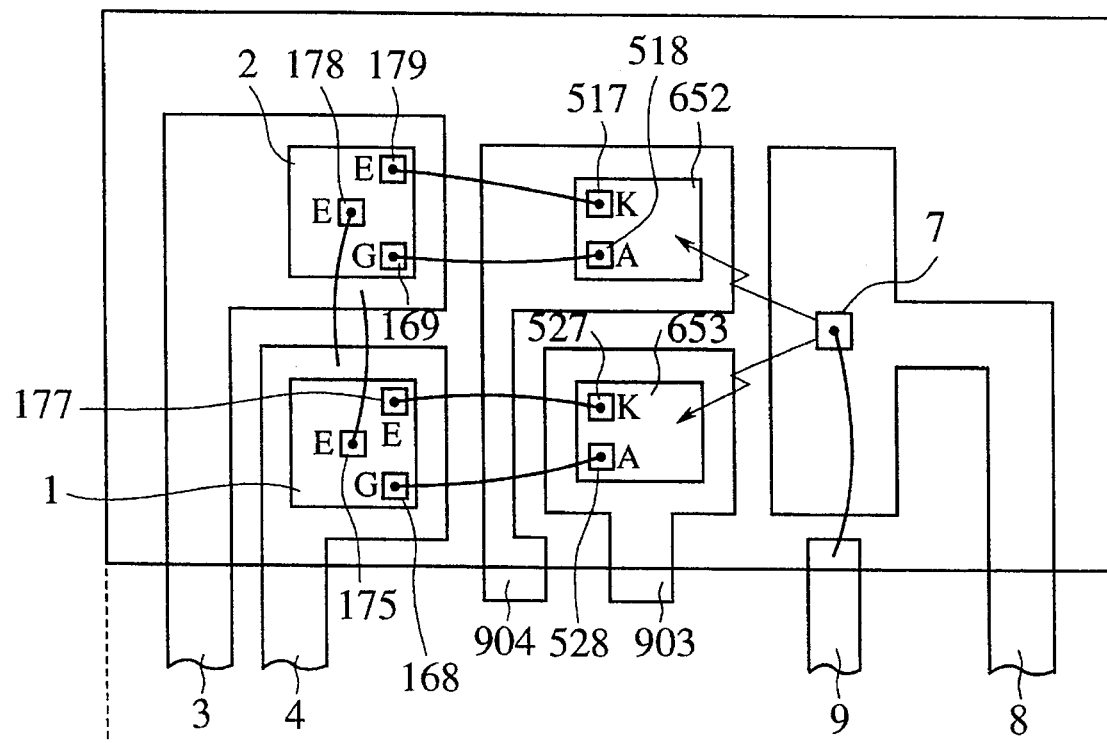
FIGS. 13A and 13B are plan and sectional views showing a bidirectional semiconductor switch according to a fourth embodiment of the present invention.
Figure 13B:
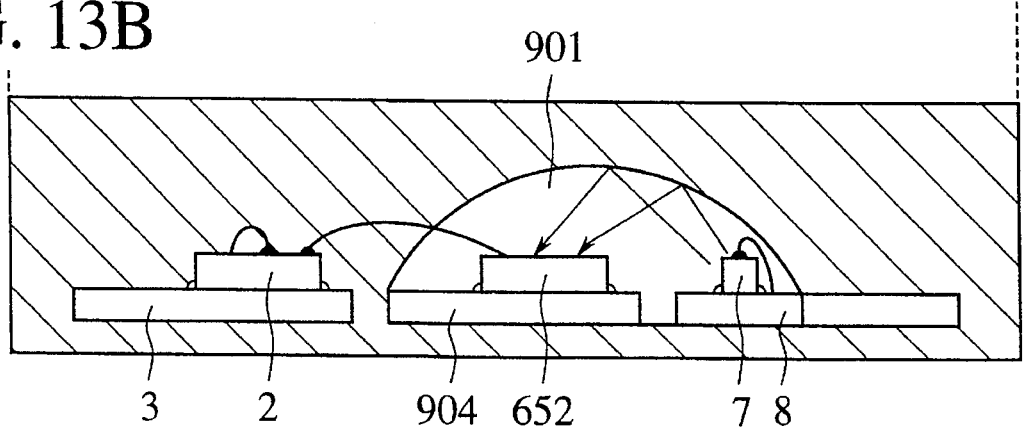

FIG. 13A is a plan view showing a bidirectional semiconductor switch according to the fourth embodiment of the present invention, and FIG. 13B is a sectional view showing the same. The fourth embodiment differs from the third embodiment in that a photodiode array 6a is formed on a semiconductor chip 652 and a photodiode array 5a on a semiconductor chip 653. The semiconductor chip 652 is set on a lead frame 904 and the semiconductor chip 653 on a lead frame 903. The semiconductor ohlps 652 and 653 and an LED 7 are packed in transparent rubber or gel silicon 901, so that light from the LED 7 effectively irradiates the photodiode arrays 5a and 6a.

Figure 14A:
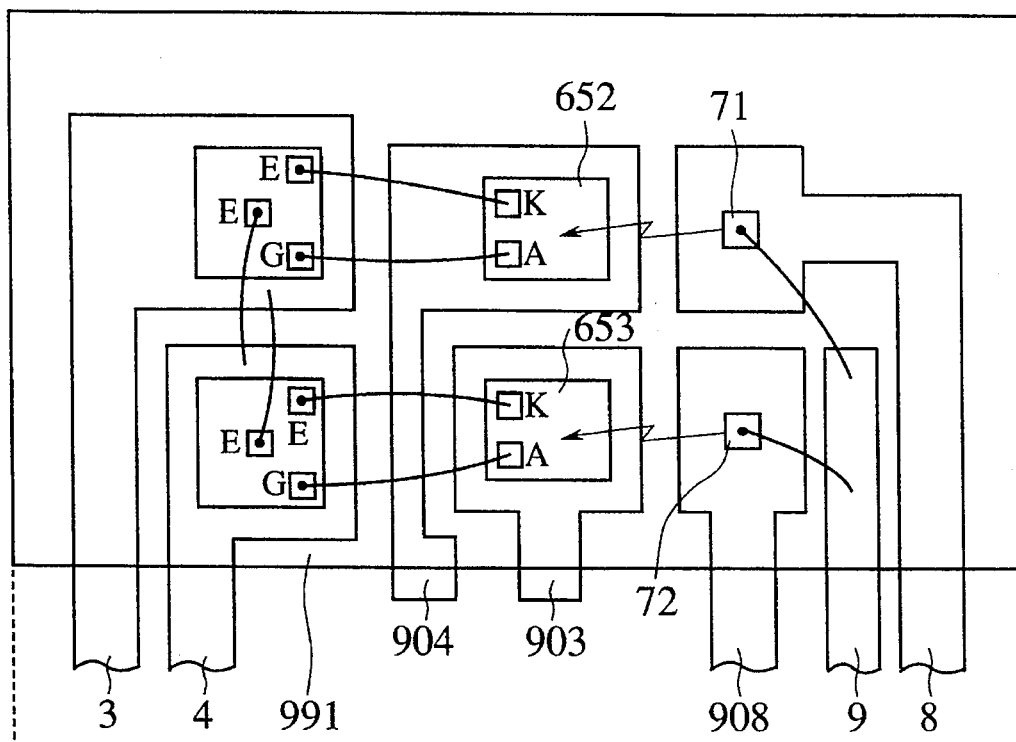
FIGS. 14A and 14B are plan and sectional views showing a bidirectional semiconductor switch according to a fifth embodiment of the present invention.
Figure 14B:
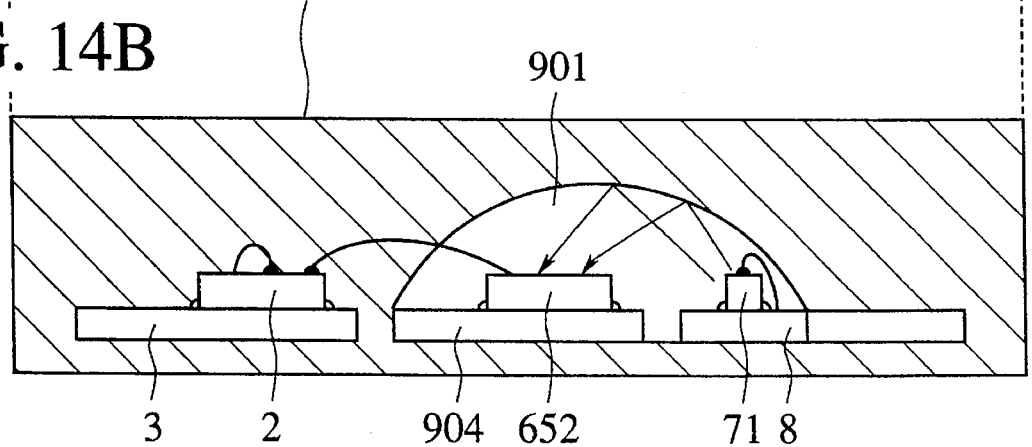

FIG. 14A is a plan view showing a bidirectional semiconductor switch according to the fifth embodiment of the present invention, and FIG. 14B is a sectional view showing the same. This semiconductor switch employs two LEDs 71 and 72 to drive IGBTs 1 and 2, respectively. The LED 71 irradiates a photodiode array 6a mounted on a semiconductor chip 652, and the LED 72 irradiates a photodiode array 5a mounted on a semiconductor chip 653. The LED 71 is mounted on a lead frame 8 and the LED 72 on a lead frame 908. The fifth embodiment is capable of simultaneously or separately controlling the gates of the IGBTs 1 and 2, to improve versatility in the application of the switch.

Figure 15A:
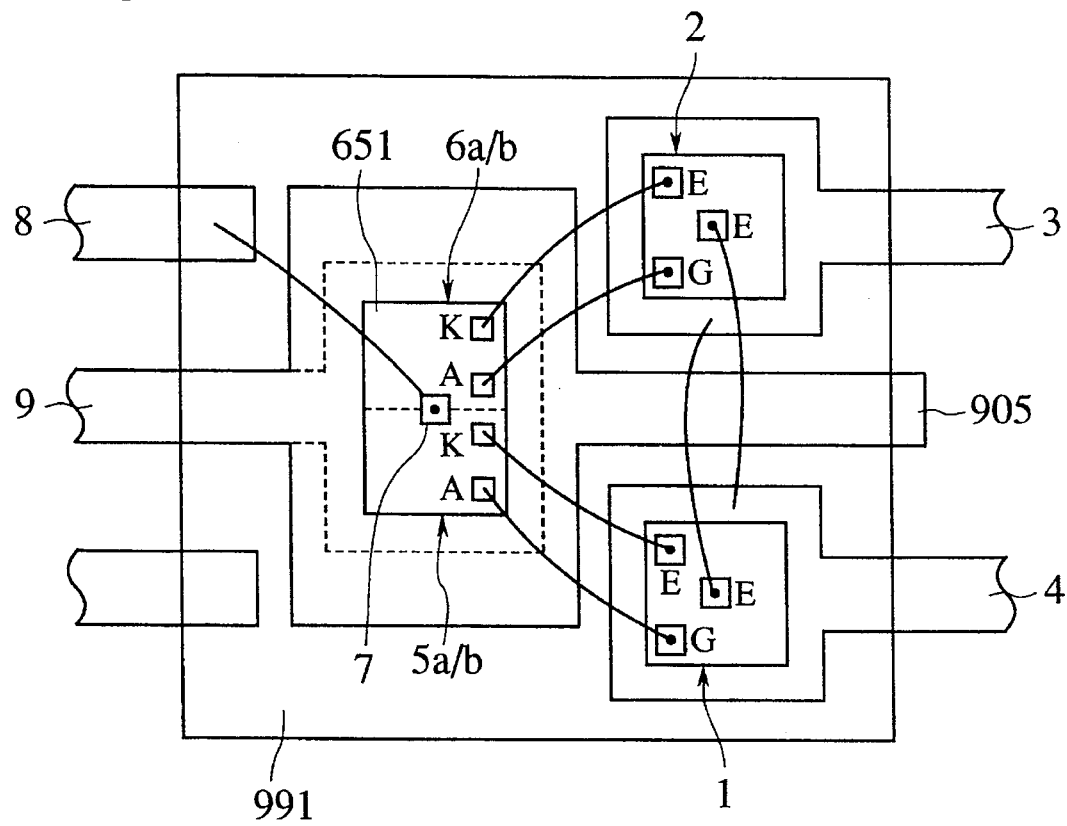
FIGS. 15A and 15B are plan and sectional views showing a bidirectional semiconductor switch according to a sixth embodiment of the present invention.
Figure 15B:
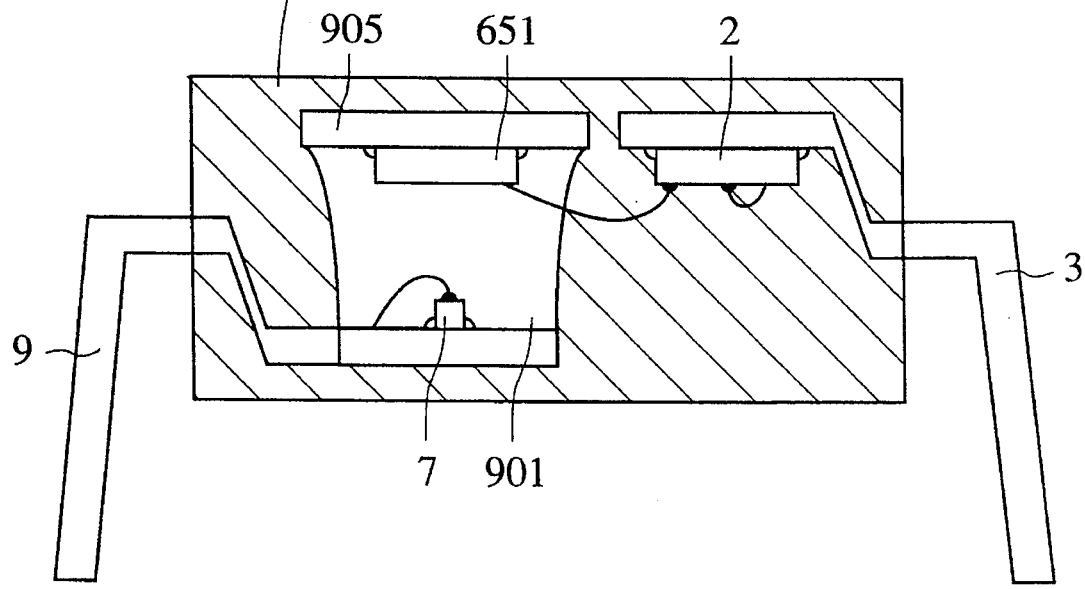

FIG. 15A is a plan view showing a bidirectional semiconductor switch according to the sixth embodiment of the present invention, and FIG. 15B is a sectional view showing the same. A LED 7 faces a semiconductor chip 651 on which photodiode arrays 5a and 6a and resistors 5b and 6b are integrated. The LED 7 and chip 681 are packed in transparent rubber or gel silicon 901, so that light from the LED 7 directly irradiates the photodiode arrays 5a and 6a. Accordingly, the LED 7 needs only small power to operate. The LED 7 is mounted on a lead frame 9, which faces a lead frame 905 on which the semiconductor chip 651 is mounted.

Figure 16:
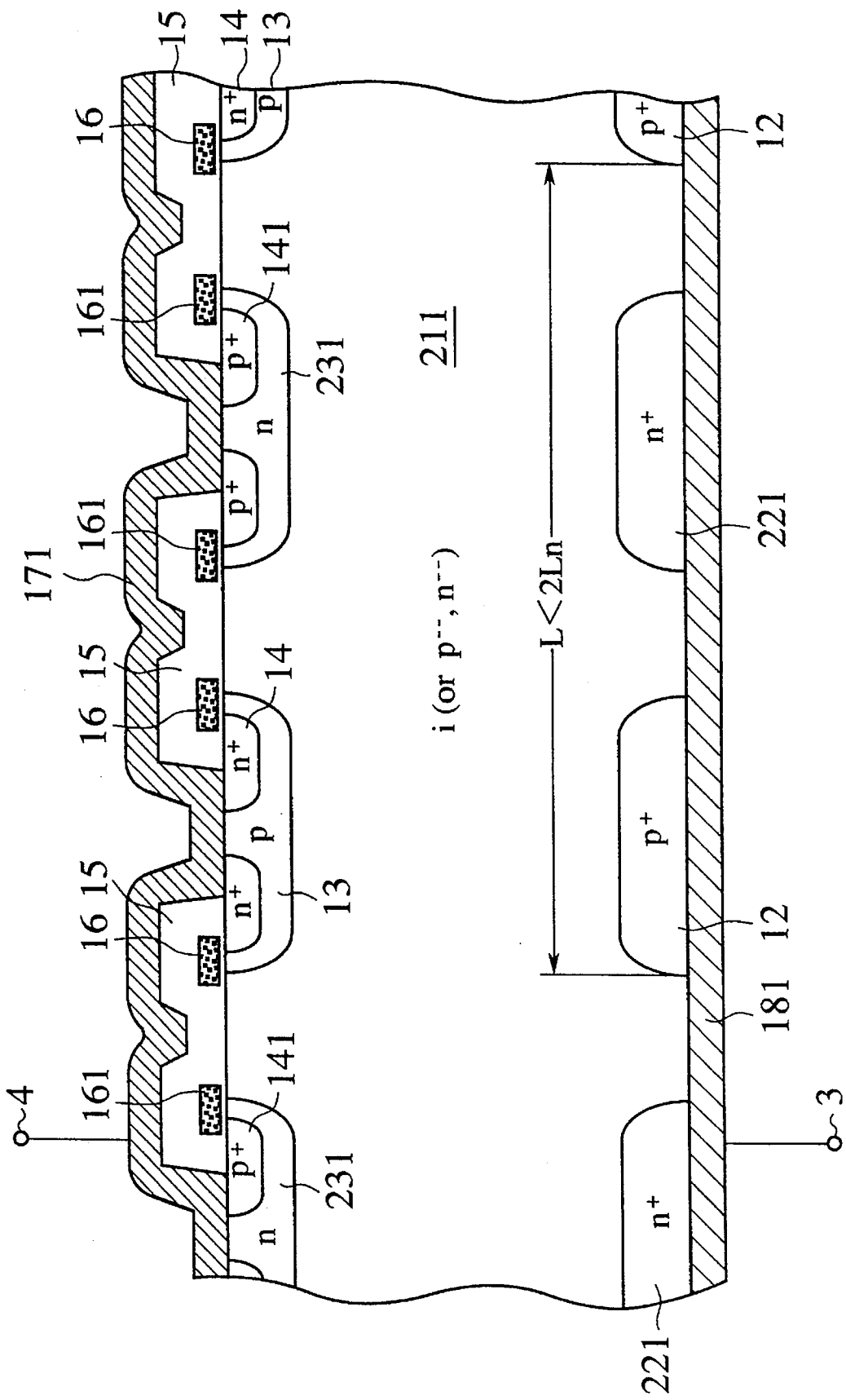
FIG. 16 is a sectional view showing a one-chip bidirectional semiconductor switch of multichannel structure with an n-channel IGBT and a p-channel IGBT being integrated on the same chip according to a seventh embodiment of the present invention.
Figure 17:
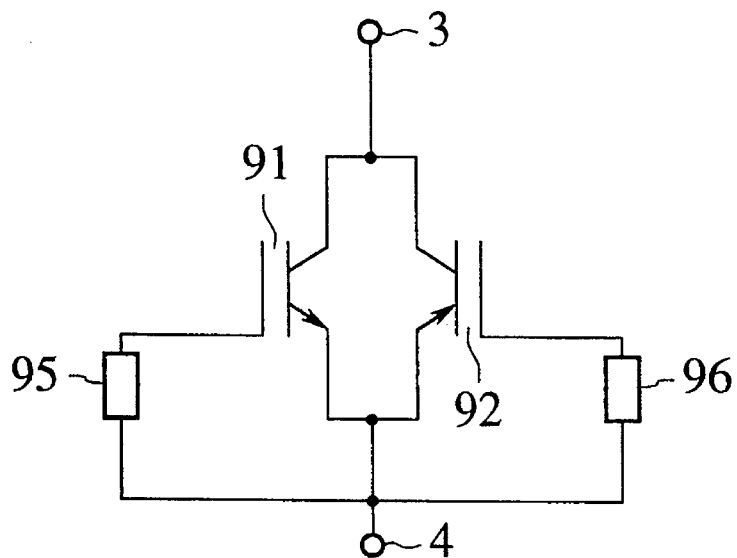
FIG. 17 is an equivalent circuit showing a unit in the one-chip bidirectional semiconductor switch of multichannel structure according to the seventh embodiment of the present invention.

FIG. 16 is a sectional view showing a one-chip bidirectional semiconductor switch that integrates IGBTs together. FIG. 17 is an equivalent circuit of a unit in the structure of FIG. 16. An n-channel IGBT 91 and a p-channel IGBT 92 are connected in parallel with each other. Gate controllers 95 and 96 control an alternating current between terminals 3 and 4. The n-channel IGBT 91 consists of an n$^+$-type emitter layer 14, a p-type base layer 13, an i-type layer 211, and a p$^+$-type anode layer 12. The p-channel IGBT 92 consists of a p$^+$-type emitter layer 141, an n-type base layer 231, the i-type layer 211, and an n$^+$-type anode layer 221. The i-type layer 211 serves as a common base region of the n-channel IGBT 91 and p-channel IGBT 92. The i-type layer 211 may be a p$^-$- or n$^-$-type layer of $1\times10^{11}$ to $2\times10^{13}$ cm$^{-3}$ in impurity concentration. In this layer, injected electrons or holes are accelerated by high electric field and drift, and therefore, they show like characteristics in any of the n$^-$-, p$^-$-, or i-type layers. The n$^-$-, p$^-$-, or i-type layer must be almost completely depleted. On a part of the base layer 13, a gate oxide film and a polysilicon gate electrode 16 are formed. The gate electrode 16 serves as the gate electrode of the n-channel IGBT 91. On a part of the base layer 231, a gate oxide film and a polysilicon gate electrode 161 are formed. The gate electrode 161 serves as the gate electrode of the p-channel IGBT 92. The gate electrode 16 is independent of the gate electrode 161 in a plan view, and the gate electrodes 16 and 161 are driven by gate controllers 95 and 96, respectively. The gate electrodes 16 and 161 may be made of not only polysilicon but also refractory metal such as W, Mo, Ti, or Co, or silicide such as $WSi_2$, $TiSi_2$, or $CoSi_2$, or polycide, i.e., composition of refractory metal and polysilicon. The IGBTs 91 and 92 have a common emitter electrode 171 and a common collector electrode 181. As is apparent in the equivalent circuit of FIG. 17, the n-channel IGBT 91 passes a current flowing from the terminal 3 toward the terminal 4, and the p-channel IGBT 92 passes a current flowing from the terminal 4 toward the terminal 3. This, however, is a theory on the equivalent circuit of FIG. 17. In practice, the anode layers 12 and 221 operate as a so-called collector-short structure to show complicated actions. When the n-channel IGBT 91 is turned OFF, electrons accumulated around the p$^+$ anode layer 12 in the i-type layer 211 are drown through the n$^+$ anode layer 221. When the IGBT 92 is turned OFF, holes accumulated around the n$^+$ anode layer 221 in the i-type layer 211 are drawn through the p$^+$ anode layer 12. This realizes a high-speed switching operation with a small tail current at the time an OFF operation. The IGBT structure of FIG. 2D is incapable of achieving a high-speed turn OFF operation because a tail current continuously flows until electrons accumulated in front of the anode layer 132 recombine with holes in the base layer 131 and disappear.

In FIG. 16, a pitch between adjacent anode layers 12 is preferably less than twice an electron diffusion length $Ln=(D_n\tau_n)^{1/2}$, and a pitch between adjacent anode layers 221 is preferably about twice a hole diffusion length $Lp=(D_p\tau_p)^{1/2}$, where $D_n$ and $D_p$ are the diffusion coefficients of electrons and holes, respectively, and $\tau_n$ and $\tau_p$ are the life time of electrons and holes, respectively. FIG. 16 only shows a unit in the one-chip bidirectional semiconductor switch according to the seventh embodiment of the present invention. Actually, many units each consisting of the n-channel IGBT 91 and p-channel IGBT 92 are connected in parallel with one other, to form a multichannel structure. For example, the p-type base layers 13 and n-type base layers 231 are alternated on the i-type layer 211. The multichannel structure is capable of controlling a large current. The number of units contained in the multichannel structure is determined according to the size of a current to be controlled. However, it may be possible that the number is one for a small power application.

Figure 18:
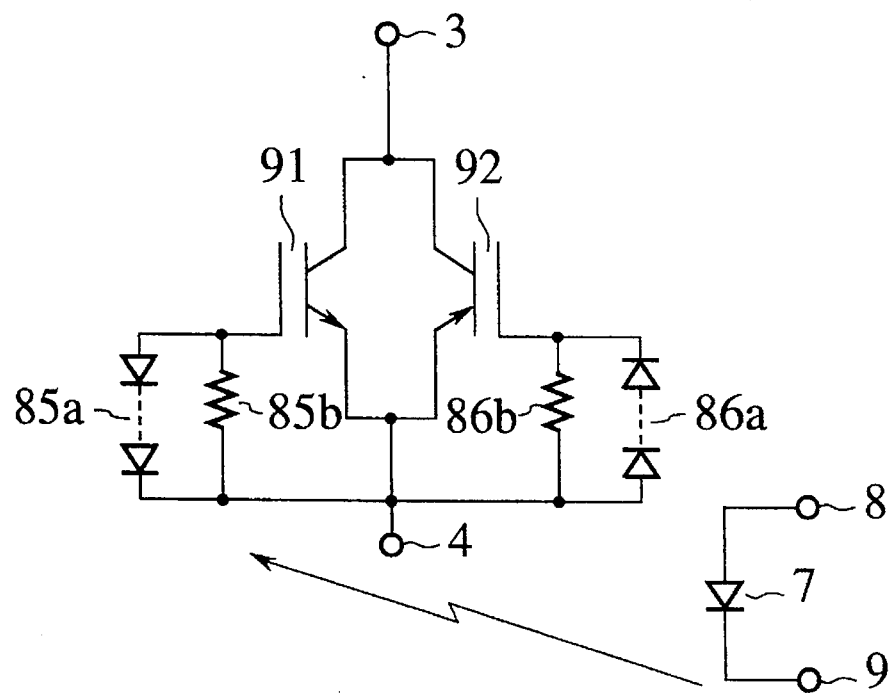
FIG. 18 is an equivalent circuit showing a one-chip bidirectional semiconductor switch driven by LED according to an eighth embodiment of the present invention.

FIG. 18 is an equivalent circuit showing a one-chip bidirectional semiconductor switch driven by LED according to the eighth embodiment of the present invention. This switch is basically the same as the switch of FIG. 16. A gate controller connected to the gate electrode 16 (FIG. 16) consists of a photodiode array 85a and a resistor 85b, and a gate controller connected to the gate electrode 161 (FIG. 16) consists of a photodiode array 86a and a resistor 86b. The photodiode arrays 85a and 86a are optically coupled with an LED 7, which is connected between input terminals 8 and 9. When a current is passed between the input terminals 8 and 9, the LED 7 emits light. If the light alternately irradiates the photodiode arrays 85a and 86a, they alternately generate photovoltaic force. The photovoltaic force alternately biases the gate electrodes of the IGBTs 91 and 92, to turn ON a path between the output terminals 3 and 4 similar to the third embodiment. The light from the LED 7 may simultaneously irradiates the photodiode arrays 85*a* and 86*a*, to simultaneously turn ON the IGBTs 91 and 92. Similar to the second to sixth embodiments, the eighth embodiment optically couples the input end with the output end but electrically separates them from each other. Accordingly, the gate controllers cause substantially no power loss, to improve the conversion efficiency of the semiconductor switch.

The gate controllers 95 and 96 of FIG. 17 and the photodiode arrays 85*a* and 86*a* and resistors 85*b* and 86*b* of FIG. 18 may be integrated on the same chip to form a smart power IC. Instead, the gate controllers 95 and 96 may be packaged on a separate ceramic substrate, to form a hybrid IC. Or it may be packed in a resin as shown in FIGS. 11 and 13 to 15. One of these structures may be selected depending on power to control and manufacturing costs. The hybrid IC may incorporate the input circuit including the LED 7 of FIG. 18.

Figure 19:
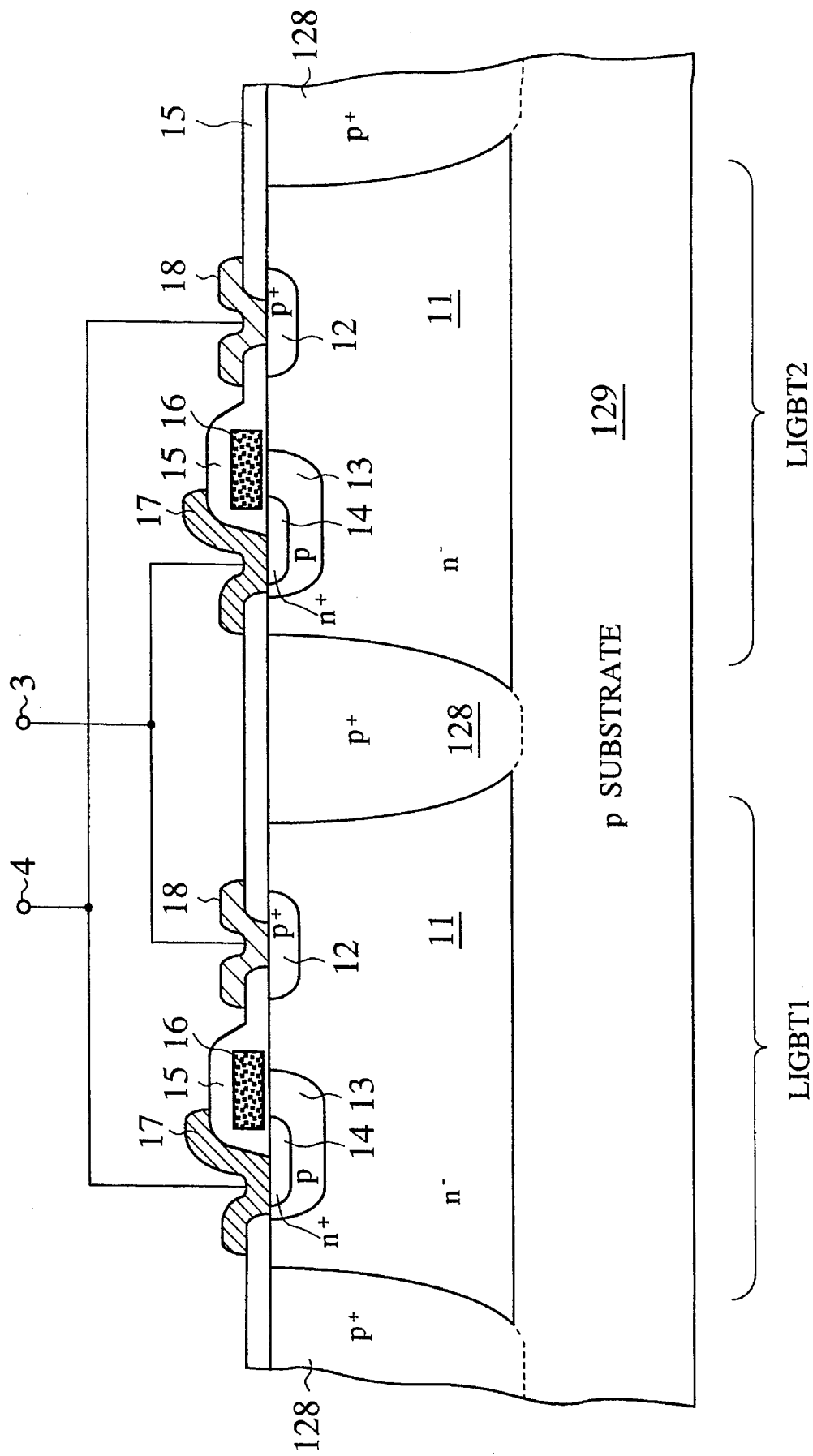
FIG. 19 is a sectional view showing two n-channel lateral IGBTs (LIGBTs) connected oppositely in parallel on the same chip with the LIGBTs being separated from each other through a pn junction according to a ninth embodiment of the present invention.

FIG. 19 shows a one-chip bidirectional semiconductor switch consisting of lateral IGBTs (LIGBTs) according to the ninth embodiment of the present invention. The ninth embodiment realizes the equivalent circuits of FIGS. 5 and 6 with n-channel LIGBTs. The LIGBTs 1 and 2 are formed on a p-type substrate 129, and $n^-$-type base layers 11 thereof are separated by a $p^+$-type diffusion region 128 that forms pn junctions. Each of the LIGBTs 1 and 2 consists of an $n^+$-type emitter layer 14, a p-type base layer 13, the $n^-$-type base layer 11, a $p^+$-type anode layer 12, an emitter electrode 17, a collector electrode 18, and a gate electrode 16. The emitter electrode 17 of the LIGBT 1 and the collector electrode 18 of the LIGBT 2 are connected to a terminal 4, and the collector electrode 18 of the LIGBT 1 and the emitter electrode 17 of the LIGBT 2 are connected to a terminal 3. The gate electrode 16 of the LIGBT 1 is connected to a gate controller 5 (not shown), and the gate electrode 16 of the LIGBT 2 is connected to a gate controller 6 (not shown). The gate controllers 5 and 6 may be integrated on the same chip, to form a smart power IC, externally arranged to form a hybrid IC or packed in a resin. One of these structures is selected depending on electric power to control, application fields, and manufacturing costs. The gate controllers 5 and 6 drive the LIGBTs 1 and 2, respectively, so that the LIGBT 1 passes a current flowing from the output terminal 3 toward the output terminal 4, and the LIGBT 2 passes a current flowing from the output terminal 4 toward the output terminal 3, to thereby control an alternating current. The ninth embodiment connects the n-channel LIGBTs oppositely in parallel, to suppress an ON-state voltage. Compared with a semiconductor switch of the same chip size consisting of MOSFETs or IGBTs, the semiconductor switch of the ninth embodiment realizes a larger controlled current, a smaller conduction loss, and improved conversion efficiency. The LGBT 1 may be of n-type channel and the LIGBT 2 of p-type channel, to realize the structures of FIGS. 17 and 18.

Figure 20:
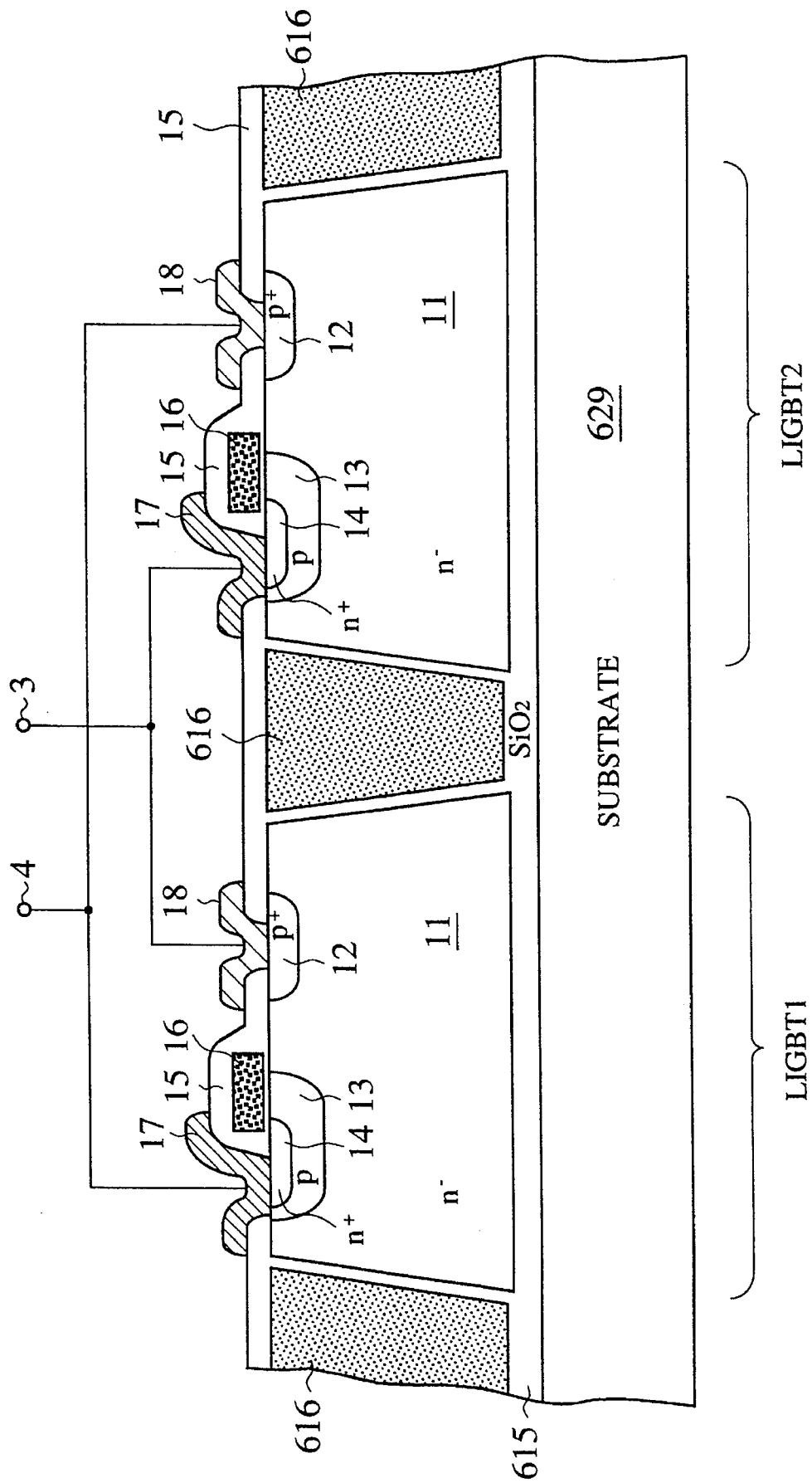
FIG. 20 is a sectional view showing n-channel LIGBTs connected oppositely in parallel and integrated on an SOI wafer with the LIGBTs being separated from each other through a dielectric isolation region according to a 10th embodiment of the present invention.

FIG. 20 is a sectional view showing a one-chip bidirectional semiconductor switch according to the 10th embodiment of the present invention. This switch has LIGBTs 1 and 2 that are formed on a semiconductor substrate 629 and are separated from each other by DI (dielectric isolation) technology. The type of the substrate 629 may be any one of p and n. The LIGBTs 1 and 2 are separated from each other by an oxide film 615 and polysilicon 616. The other parts of the 10th embodiment are the same as those of the ninth embodiment. To fabricate the LIGBTs, an SOI wafer with the oxide film 615 being interposed between the substrate 629 and an $n^-$-type layer 11 is fabricated by silicon direct bonding (SDB) technology. Grooves are formed from the surface of the layer 11 up to the oxide film 615 by RIE or ECR ion etching. The grooves may be formed by orientation-dependent wet etching with potassium hydroxide (KOH) solution, etc. An oxide film of 0.5 to 2 µm thick is formed by thermal oxidation. The polysilicon 616 is deposited by reduced pressure CVD on the oxide film, to fill the grooves. This completes the dielectric isolation region of FIG. 20. If the surface after depositing the polysilicon 616 is irregular to cause a problem on photolithography, the surface of the SOI wafer is polished, to make the surface of the polysilicon 616 flush with the surface of the layer 11. Thereafter, the p-type base layer 13 of the IGBTs is diffused. The emitter electrode 17 of the LIGBT 1 and the collector electrode 18 of the LIGBT 2 are connected to a terminal 4, and the collector electrode 18 of the LIGBT 1 and the emitter electrode 17 of the LIGBT 2 are connected to a terminal 3. The gate electrode 16 of the LIGBT 1 is connected to a gate controller 5 (not shown), and the gate electrode 16 of the LIGBT 2 is connected to a gate controller 6 (not shown). The gate controllers may employ photodiode arrays 5*a* and 5*b* as shown in FIG. 6. The gate controllers 5 and 6 and photodiode arrays 5*a* and 5*b* may be integrated on the same chip to form a smart power IC, or arranged outside to form a hybrid IC. One of these structures is selected depending on electric power to control, application fields, and manufacturing costs. The gate controllers 5 and 6 drive the LIGBTs 1 and 2, respectively, so that the LIGBT 1 passes a current flowing from the output terminal 3 toward the output terminal 4, and the LIGBT 2 passes a current flowing from the output terminal 4 toward the output terminal 3, to thereby control an alternating current. The 10th embodiment connects the n-channel LIGBTs oppositely in parallel to suppress an ON-state voltage. Compared with a semiconductor switch of the same chip area consisting of MOSFETs or IGBTs, the 10th embodiment achieves a larger controlled current, a lower conductivity loss, and higher-conversion efficiency. The LIGBT 1 may be of n-channel and the LIGBT 2 of p-channel, to form the circuit of FIGS. 17 and 18.

Figure 21:
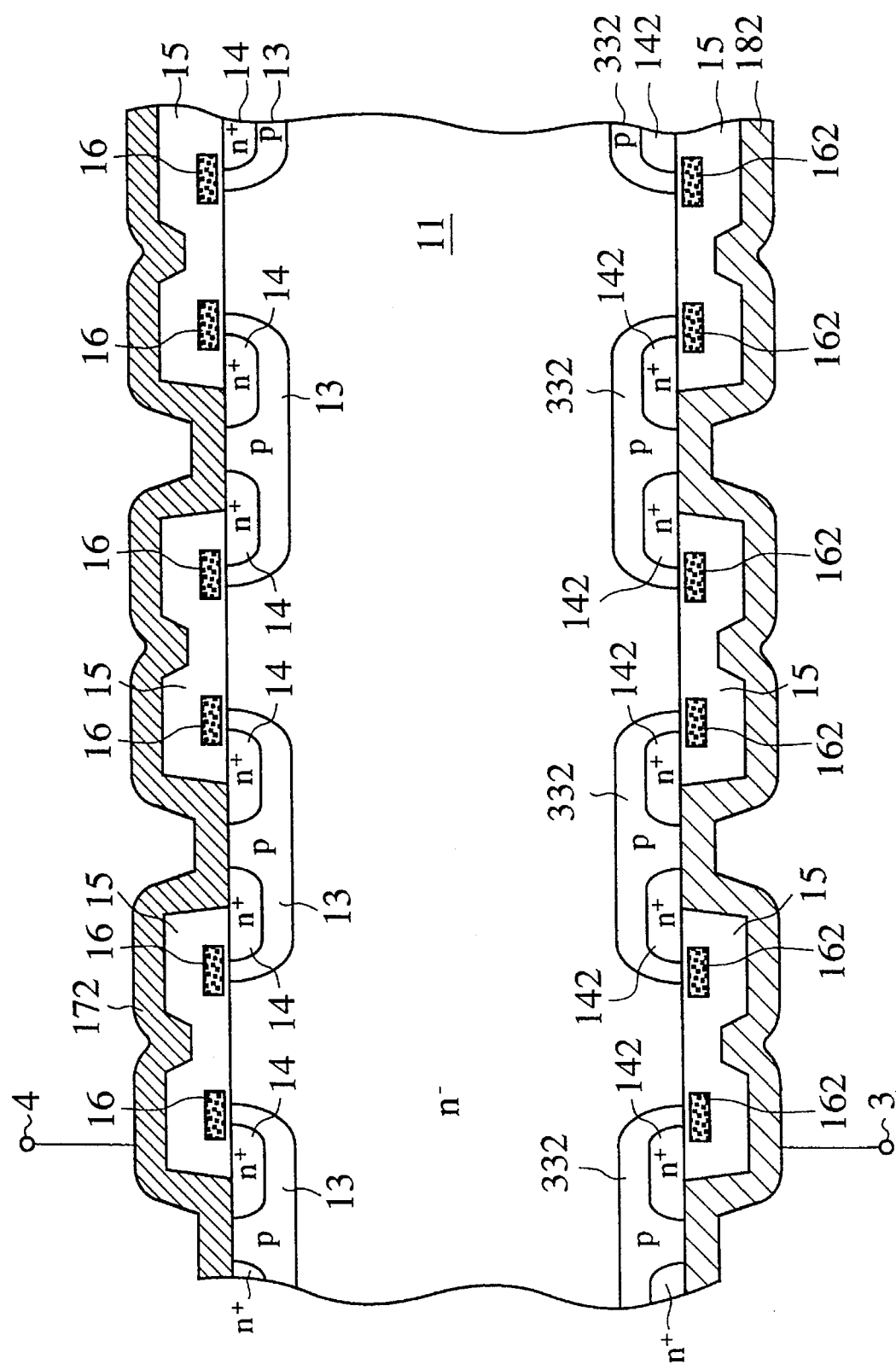
FIGS. 21 and 22 are sectional views showing one-chip bidirectional semiconductor switches according to 11th and 12th embodiments of the present invention, respectively.

FIG. 21 is a sectional view showing a one-chip bidirectional semiconductor switch according to the 11th embodiment of the present invention. A first n-channel IGBT 1 is formed of an $n^+$-type emitter layer 14, a p-type base layer 13, an $n^-$-type substrate 11, and a p-type anode layer 332. A second n-channel IGBT 2 is formed of an $n^+$-type emitter layer 142, a p-type base layer 332, the $n^-$-type substrate 11, and a p-type anode layer 13, to carry out a reverse operation. Namely, the p-type base layer 13 of the first IGBT 1 serves as the p-type a node layer 13 of the second IGBT 2, and the p-type anode layer 332 of the first IGBT 1 serves as the p-type base layer 332 of the second IGBT 2. On a part of the base layer 13 above the substrate 11, a gate oxide film is formed, and on the gate oxide film, a polysilicon gate electrode 16 is formed as the gate electrode of the first n-channel IGBT 1. On a part of the p-type base layer 332 under the substrate 11, a gate oxide film is formed, and on the gate oxide film, a polysilicon gate electrode 162 is formed as the gate electrode of the second n-channel IGBT 2. The gate electrodes 16 and 162 are driven by gate controllers 5 and 6 (not shown), respectively. The gate electrodes 16 and 162 may be made of not only polysilicon but also refractory metal such as W, Mo, Ti, and Co, or silicide such as $WSi_2$, $TiSi_2$, and $CoSi_2$, or polycide, i.e., a composite film of refractory metal and polysilicon. The emitter layer 14 of the IGBT 1 and the anode layer 13 of the IGBT 2 are connected to a metal electrode 172, and the anode layer 332 of the IGBT 1 and the emitter layer 142 of the IGBT 2 are connected to a metal electrode 182. Namely, an equivalent circuit of the 11th embodiment is the same as one of FIGS. 5 and 6. The first n-channel IGBT 1 passes a current flowing from a terminal 3 toward a terminal 4, and the second n-channel IGBT 2 passes a current flowing from the terminal 4 toward the terminal 3.

Figure 22:
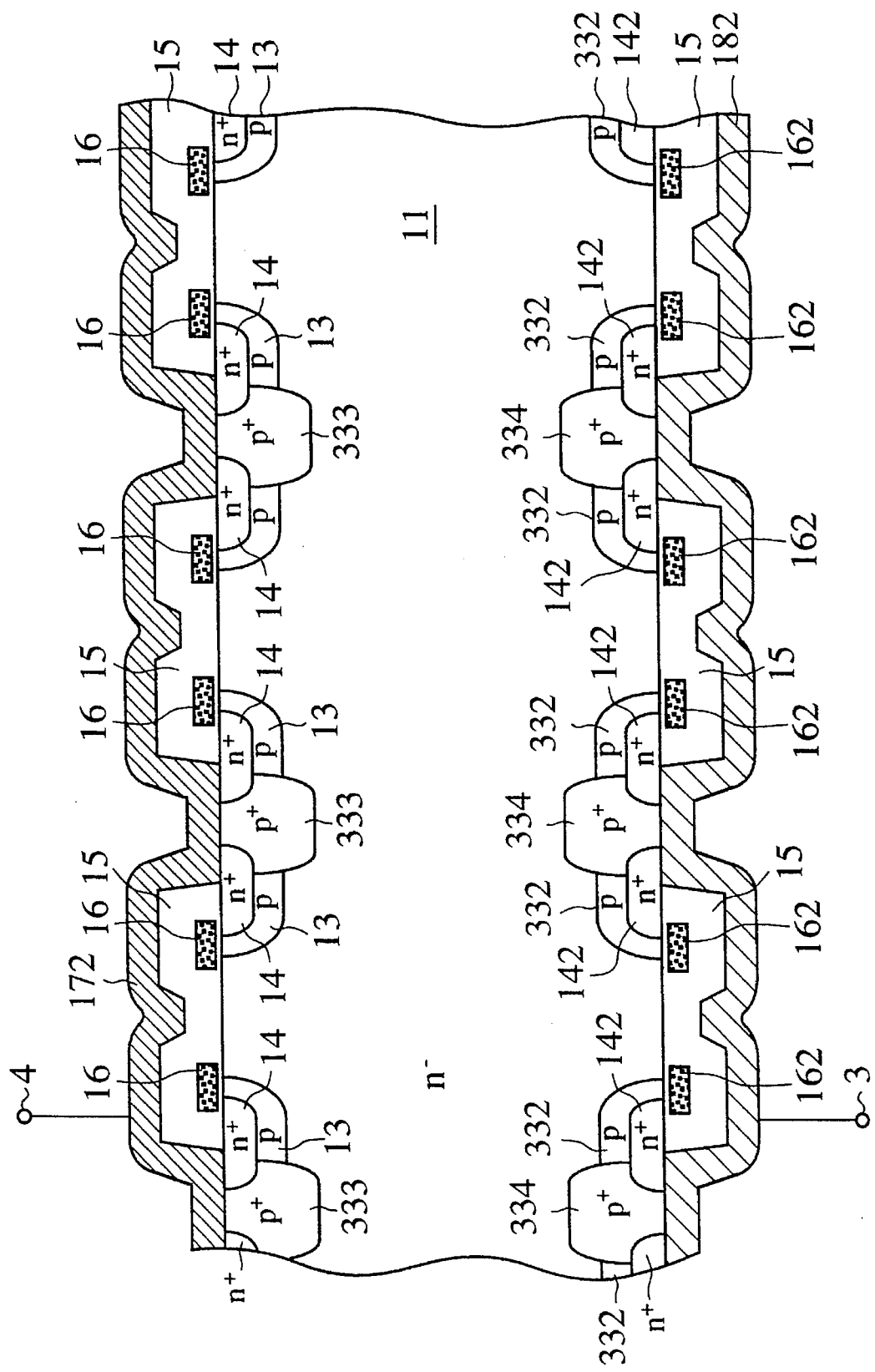

FIG. 22 is a sectional view showing a one-chip bidirectional semiconductor switch according to the 12th embodiment of the present invention. According to the 11th embodiment of FIG. 21, the p-type base layer 13 of the first IGBT 1 serves as the p-type anode layer 13 of the second IGBT 2, so that the impurity concentration of the p-type anode layer 13 must be limited. It must be about $5\times10^{16}$ to $1\times10^{18}$ cm$^{-3}$. If it is higher than this, the threshold of the n-type MOSFET formed in the p-type base layer 13 will be too high. This relatively low impurity concentration results in decreasing the injection efficiency of holes from the p-type anode layer 13 of the second IGBT 2 and also decreasing the injection efficiency of holes from the p-type anode layer 332 of the first IGBT 1. The 12th embodiment of FIG. 22 solves these problems. According to the 12th embodiment, the p$^+$-type anode layer of a first IGBT 1 is a p$^+$-type region 334, and the p$^+$-type anode layer of a second IGBT 2 is a p$^+$-type region 333. The operation of the 12th embodiment is basically the same as that of the 11th embodiment. The 12th embodiment improves the injection efficiency of holes from the anode layers 333 and 334, to enlarge a change in conductivity in an n$^-$-type substrate 11 and decrease an ON-state resistance, to thereby minimize a conduction loss.

Figure 23:
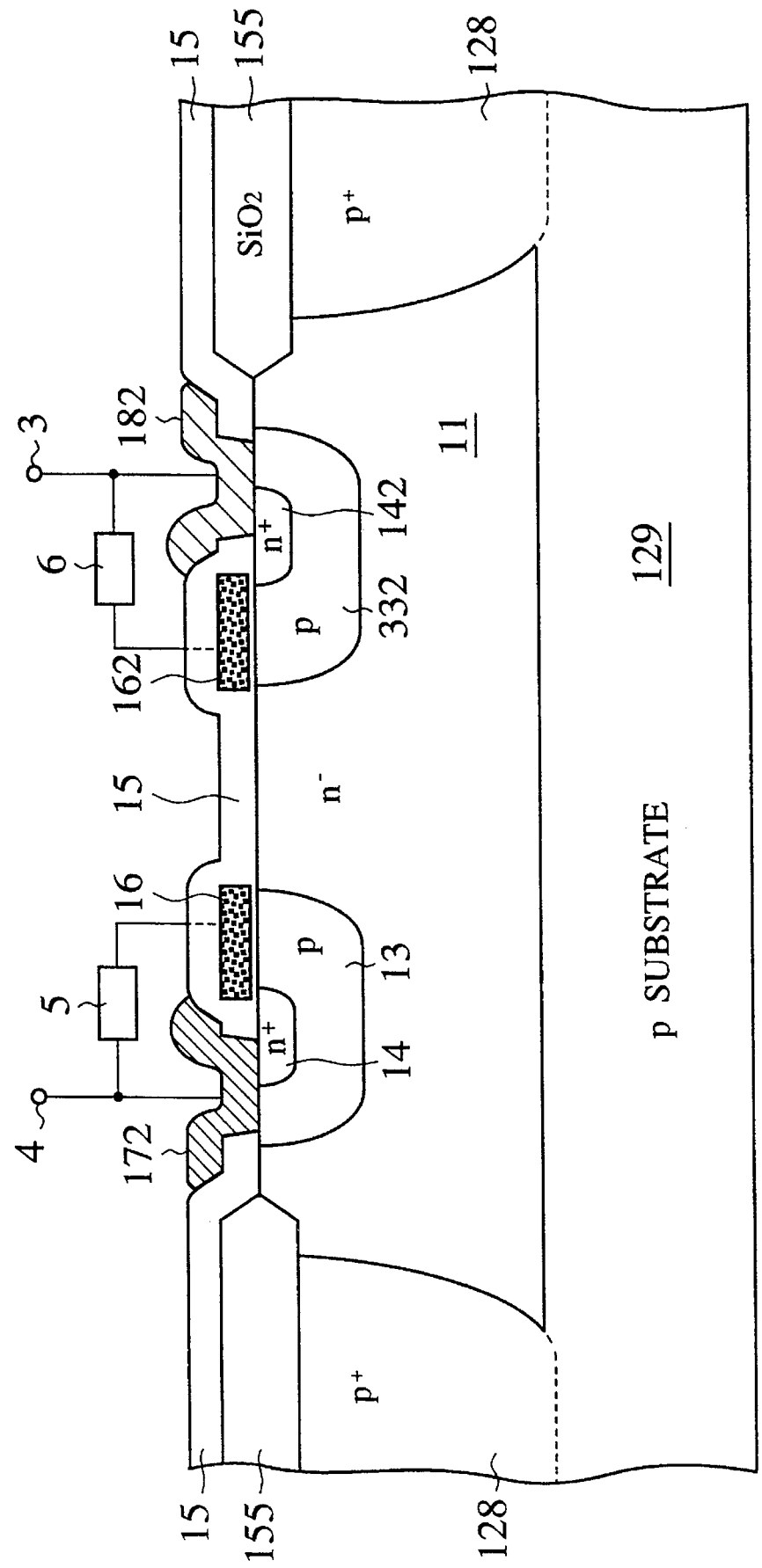
FIG. 23 is a sectional view showing a one-chip bidirectional semiconductor switch employing LIGBTs according to a 13th embodiment of the present invention.

FIG. 23 is a sectional view showing a one-chip bidirectional semiconductor switch employing LIGBTs according to the 13th embodiment of the present invention. The figure shows a unit in a multichannel structure. Each unit consists of a p-type substrate 129 and a pair of LIGBTs 1 and 2 epitaxially grown on the substrate 129. An n$^-$-type base layer 11 of the LIGBTs of the unit is isolated from that of an adjacent unit by a p$^+$-type diffusion region 128 that forms pn junctions. The LIGBT 1 consists of an n$^+$-type emitter layer 14, a p-type base layer 13, the n$^-$-type base layer 11, a p-type anode layer 332, an emitter electrode 172, a collector electrode 182, and a gate electrode 16. The LIGBT 2 consists of an n$^+$-type emitter layer 142, a p-type base layer 332, the n$^-$-type base layer 11, a p-type anode layer 13, an emitter electrode 182, a collector electrode 172, and a gate electrode 162. Similar to the 11th embodiment of FIG. 21, the p-type base layer 13 of the LIGBT 1 serves as the p-type anode layer 13 of the LIGBT 2, and the p-type base layer 332 of the LIGBT 2 serves as the p-type anode layer 332 of the LIGBT 1. The emitter electrode 172 of the LIGBT 1 is common to the collector electrode 172 of the LIGBT 2 and is connected to a terminal 4. The collector electrode 182 of the LIGBT 1 is common to the emitter electrode 182 of the LIGBT 2 and is connected to a terminal 3. A gate controller 5 is connected between the terminal 4 and the gate electrode 16, and a gate controller 6 is connected between the terminal 3 and the gate electrode 162. The gate controllers 5 and 6 drive the LIGBT 1 and 2, respectively, so that the LIGBT 1 passes a current flowing from the output terminal 3 toward the output terminal 4, and the LIGBT 2 passes a current flowing from the output terminal 4 toward the output terminal 3, to thereby control an alternating current. The 13th embodiment is capable of suppressing an ON-state voltage because it is formed of the n-channel LIGBTs connected oppositely in parallel. Compared with a semiconductor switch of the same chip area formed of MOSFETs or IGBTs, the 13th embodiment realizes a larger control current, a lower conduction loss, and higher conversion efficiency.

Compared with the 11th and 12th embodiments, the 13th embodiment requires no mask alignment process of both faces, to simplify manufacturing processes and improve productivity. P$^+$-type anode layers 333, 334 may be added to p-type base layers 13, 332 in a similar form as shown in FIG. 22, if a lower ON-state resistance is required.

Various modifications will become possible for those skilled in the art after receiving the teachings of the present disclosure without departing from the scope thereof. In particular, the IGBTs according to the first to 13th embodiments of the present invention may be n-type buffer IGBTs, collector-short IGBTs, or Schottky-drain-contact IGBTs. Instead of IGBTs, it is possible to employ insulated gate semiconductor devices such as ESTs (emitter switched thyristors), BRTs (base resistance controlled thyristors), MCSITHs (MOS controlled SI thyristors), and MCTs (MOS controlled thyristors).

Although the first to sixth and ninth to 13th embodiments of the present invention relate to n-channel IGBTs, they are also applicable to p-channel IGBTs. The present invention is not limited to Si devices. For example, the present invention may prepare a bidirectional semiconductor switch from SiC, to provide a power device for efficiently controlling an alternating current as well as a direct current at temperatures over 600 degrees centigrade. The present invention is also applicable to insulated gate compound semiconductor devices employing GaAs-GaAlAs heterojunction, and MOS compound semiconductor devices employing an SiO$_2$ film formed on InP. The bidirectional semiconductor switches according to the present invention are easily applied to programmable controllers and telephone loops, etc.

What is claimed is:

1. A bidirectional semiconductor switch comprising:
   (a) a first insulated gate semiconductor device having a first main electrode, a second main electrode, a first gate insulating film disposed between the first and second main electrodes, and a first gate electrode formed on the first gate insulating film;
   (b) a second insulated gate semiconductor device having a first main electrode connected to the second main electrode of said first insulated gate semiconductor device, a second main electrode connected to the first main electrode of said first insulated gate semiconductor device, a second gate insulating film disposed between the first and second main electrodes of the second insulated gate semiconductor device, and a second gate electrode formed on the second gate insulating film;
   (c) a first gate controller connected to the first gate electrode for capacitively controlling the current flowing between the first and second main electrodes of said first insulated gate semiconductor device; and
   (d) a second gate controller connected to the second gate electrode for capacitively controlling the current flowing between the first and second main electrodes of said second insulated gate semiconductor device.

2. A bidirectional semiconductor switch as recited in claim 1, wherein said first and second insulated gate semiconductor devices are a first IGBT and a second IGBT, respectively.

3. A bidirectional semiconductor switch comprising:
   (a) a first IGBT having a first emitter layer, a first emitter electrode on the first emitter layer and on a first base layer, a first gate insulating film on the first base layer, a first gate electrode on the first gate insulating film, a first anode layer, and a first anode electrode on the first anode layer;

(b) a second IGBT having a second emitter layer, a second emitter electrode on the second emitter layer connected to the first anode electrode, a second base layer, a second gate insulating film on the second base layer, a second gate electrode on the second gate insulating film, a second anode layer, and a second anode electrode on the second anode layer connected to the first emitter electrode;

(c) a first gate controller connected between the first emitter electrode and the first gate electrode;

(d) a second gate controller connected between the second emitter electrode and the second gate electrode, wherein the first and second IGBTs consist of the emitter layers of the same conductivity type and the base layers of the same conductivity type.

4. A bidirectional semiconductor switch comprising:

(a) an n-channel IGBT having a first emitter electrode, a first gate electrode, and a first anode electrode;

(b) a p-channel IGBT having a second emitter electrode connected to the first emitter electrode, a second gate electrode, and a second anode electrode connected to the first anode electrode;

(c) a first gate controller; and (d) a second gate controller, wherein said first gate controller is connected between the first emitter electrode and the first gate electrode and said second gate controller is connected between the second emitter electrode and the second gate electrode.

5. A bidirectional semiconductor switch as recited in claim 1, wherein said first and second gate controllers are light-triggered controllers for providing photovoltaic forces to the first and second gate electrodes in response to light emitted from a light emitting element electrically isolated from the first and second gate controller.

6. A bidirectional semiconductor switch as recited in claim 5, wherein said first and second gate controllers include each at least a photodiode array.

7. A bidirectional semiconductor switch comprising:

(a) a first IGBT having a first emitter, a first gate, and a first anode electrode;

(b) a second IGBT having a second emitter connected to the first anode electrode, a second gate electrode, and a second anode electrode connected to the first emitter electrode;

(c) a first gate controller connected to the first gate electrode; and (d) a second gate controller connected to the second gate electrode, wherein the first and second IGBTs are integrated on a same semiconductor substrate.

8. A bidirectional semiconductor switch comprising:

(a) a first IGBT having a first emitter, a first gate, and a first anode electrode;

(b) a second IGBT having a second emitter connected to the first anode electrode, a second gate electrode, and a second anode electrode connected to the first emitter electrode;

(c) a first gate controller connected to the first gate electrode; and (d) a second gate controller connected to the second gate electrode, wherein the first and second IGBTs and said first and second gate controllers are mounted on a single ceramic substrate, or on a single semi-insulated metal substrate.

9. A bidirectional semiconductor switch comprising:

(a) a first IGBT having a first emitter, a first gate, and a first anode electrode;

(b) a second IGBT having a second emitter connected to the first anode electrode, a second gate electrode, and a second anode electrode connected to the first emitter electrode;

(c) a first gate controller connected to the first gate electrode; and (d) a second gate controller connected to the second gate electrode, wherein:
the first IGBT is mounted on a first lead frame;
the second IGBT is mounted on a second lead frame;
said first and second gate controllers are mounted on a third lead frame; and
the first, second, and third lead frames are packed in resin to form a single package.

10. A bidirectional semiconductor switch as recited in claim 9, further comprising a light emitting element mounted on a fourth lead frame, wherein said first and second gate controllers include each a photodiode array to be irradiated with light from the light emitting element, and the first, second, third, and fourth lead frames are packed in resin to form a single package.

11. A bidirectional semiconductor switch as recited in claim 10, wherein the light emitting element and photodiode arrays are packed in transparent rubber or gel silicon resin.

12. A bidirectional semiconductor switch as recited in claim 11, wherein the light emitting element and photodiode arrays are arranged to face each other so that light from the light emitting element directly irradiates the photodiode arrays.

13. A bidirectional semiconductor switch comprising:

(a) a first IGBT having a first emitter, a first gate, and a first anode electrode;

(b) a second IGBT having a second emitter connected to the first anode electrode, a second gate electrode, and a second anode electrode connected to the first emitter electrode;

(c) a first gate controller connected to the first gate electrode; and (d) a second gate controller connected to the second gate electrode, wherein:
the first IGBT is mounted on a first lead frame;
the second IGBT is mounted on a second lead frame;
said first gate controller is mounted on a third lead frame;
said second gate controller is mounted on a fourth lead frame; and
the first, second, third, and fourth lead frames are packed in resin to form a single package.

14. A bidirectional semiconductor switch as recited in claim 13, further comprising a light emitting element mounted on a fifth lead frame, wherein said first and second gate controllers include each a photodiode array to be irradiated with light from the light emitting element, and the first to fifth lead frames are packed in resin to form a single package.

15. A bidirectional semiconductor switch as recited in claim 14, wherein the light emitting element and photodiode arrays are packed in transparent rubber or gel silicon resin.

16. A bidirectional semiconductor switch as recited in claim 14, further comprising a second light emitting element mounted on a sixth lead frame, wherein the light emitting element and said first gate controller are packed in first transparent rubber or gel silicon resin, and the second light emitting element and said second gate controller are packed in second transparent rubber or gel silicon resin, and the first and second transparent rubber or gel silicon resin are packed in another resin to accommodate the first to sixth lead frames in the same package.

17. A bidirectional semiconductor switch as recited in claim 3, wherein the first and second IGBTs are lateral IGBTs (LIGBTs) that are integrated on a semiconductor substrate.

18. A bidirectional semiconductor switch as recited in claim 4, wherein:

the n-channel IGBT consists of at least a p-type base layer formed on the surface of a high specific-resistance semiconductor substrate, an $n^+$-type emitter layer formed inside the p-type base layer, a gate electrode formed on a gate insulation film that is formed on a part of the p-type base layer, and a $p^+$-type anode layer formed on the bottom surface of the semiconductor substrate; and the p-channel IGBT consists of at least an n-type base layer formed on the top surface of the semiconductor substrate, a $p^+$-type emitter layer formed inside the n-type base layer, a gate electrode formed on a gate insulation film that is formed on a part of the n-type base layer, and an $n^+$-type anode layer formed on the bottom surface of the semiconductor substrate.

19. A bidirectional semiconductor switch as recited in claim 18, wherein a plurality of $p^+$-type anode layers are regularly arranged along the bottom surface of the semiconductor substrate at intervals of L with L being smaller than $2L_n$ where $L_n$ is an electron diffusion length.

20. A bidirectional semiconductor switch comprising:

(a) a first IGBT formed on a first semiconductor chip, having a first emitter, a first gate, and a first anode electrode;

(b) a second IGBT formed on a second semiconductor chip, having a second emitter connected to the first anode electrode, a second gate electrode and a second anode electrode connected to the first emitter electrode;

(c) a first gate controller connected to the first gate electrode; and (d) a second gate controller connected to the second gate electrode, wherein each side of the first and second semiconductor chips is covered with a diffusion layer of high impurity concentration.

21. A bidirectional semiconductor switch comprising:

(a) a first IGBT formed on a first semiconductor chip, having a first emitter, a first gate, and a first anode electrode;

(b) a second IGBT formed on a second semiconductor chip, having a second emitter connected to the first anode electrode, a second gate electrode, and a second anode electrode connected to the first emitter electrode;

(c) a first gate controller connected to the first gate electrode; and (d) a second gate controller connected to the second gate electrode, wherein the peripheries of the top and bottom surfaces of the first and second semiconductor chips are beveled by etching, and the beveled surface is covered with a glass layer.

22. A bidirectional semiconductor switch comprising:

(a) a semiconductor substrate of first conductivity type;

(b) a first semiconductor region of second conductivity type formed on a first principal plane of said semiconductor substrate, and a first emitter region of first conductivity type formed inside said first semiconductor region;

(c) a second semiconductor region of second conductivity type formed on a second principal plane opposite to the first principal plane of said semiconductor substrate, and a second emitter region of first conductivity type formed inside said second semiconductor region;

(d) a first gate electrode formed on a gate oxide film that is formed on the surface of said first semiconductor region;

(e) a second gate electrode formed on a gate oxide film that is formed on the surface of said second semiconductor region;

(f) a first main electrode region electrically connected to said first semiconductor region and first emitter region;

(g) a second main electrode region electrically connected to said second semiconductor region and second emitter region;

(h) a first gate controller electrically connected between said first main electrode region and said first gate electrode; and (i) a second gate controller electrically connected between said second main electrode region and said second gate electrode.

23. A bidirectional semiconductor switch as recited in claim 22, further comprising:

a first anode region of second conductivity type formed adjacent to said second semiconductor region, the impurity concentration of the first anode region being higher than that of said second semiconductor region; and a second anode region of second conductivity type formed adjacent to said first semiconductor region, the impurity concentration of the second anode region being higher than that of said first semiconductor region.

24. A bidirectional semiconductor switch comprising:

(a) a first semiconductor region of second conductivity type formed on a semiconductor substrate of first conductivity type;

(b) second and third semiconductor regions of first conductivity type formed on the surface of said first semiconductor region;

(c) first and second emitter regions of second conductivity type formed inside said second and third semiconductor regions, respectively;

(d) first and second gate electrodes formed on gate oxide films that are formed on the surfaces of said second and third semiconductor regions, respectively;

(e) a first main electrode region electrically connected to said second semiconductor region and first emitter region;

(f) a second main electrode region electrically connected to said third semiconductor region and second emitter region;

(g) a first gate controller electrically connected between said first main electrode region and said first gate electrode; and (h) a second gate controller electrically connected between said second main electrode region and said second gate electrode.

25. A bidirectional semiconductor switch as recited in claim 22, wherein said first and second gate controllers are driven by light emitted from a light emitting element.

26. A bidirectional semiconductor switch as recited in claim 24, wherein said first and second gate controllers are driven by light emitted from a light emitting element.

27. A bidirectional semiconductor switch as recited in claim 25, wherein said first and second gate controllers include each at least a photodiode array.

* * * * *